(12) United States Patent
Fan

(10) Patent No.: US 12,113,003 B2
(45) Date of Patent: Oct. 8, 2024

(54) SEMICONDUCTOR DEVICE WITH COMPOSITE MIDDLE INTERCONNECTORS

(71) Applicant: NANYA TECHNOLOGY CORPORATION, New Taipei (TW)

(72) Inventor: Pei Cheng Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/217,721

(22) Filed: Jul. 3, 2023

(65) Prior Publication Data

US 2023/0361013 A1    Nov. 9, 2023

Related U.S. Application Data

(62) Division of application No. 17/560,608, filed on Dec. 23, 2021, now Pat. No. 11,881,446.

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 21/486* (2013.01); *H01L 23/49833* (2013.01); *H01L 23/49838* (2013.01); *H01L 25/0655* (2013.01); *H01L 25/18* (2013.01); *H01L 25/50* (2013.01); *H01L 24/04* (2013.01); *H01L 24/05* (2013.01); *H01L 24/13* (2013.01); *H01L 24/16* (2013.01); *H01L 24/73* (2013.01); *H01L 2224/0401* (2013.01); *H01L 2224/05551* (2013.01);
(Continued)

(58) Field of Classification Search
None
See application file for complete search history.

(56) References Cited

U.S. PATENT DOCUMENTS 11,462,479 B2 * 10/2022 Nam ................... H01L 23/5386
2012/0168937 A1 * 7/2012 Lee ...................... B23K 3/0623
228/244

(Continued)

OTHER PUBLICATIONS

Office Action mailed on Aug. 1, 2023 related to U.S. Appl. No. 17/560,608, wherein this application is a DIV of U.S. Appl. No. 17/560,608.

*Primary Examiner* — Long Pham
(74) *Attorney, Agent, or Firm* — Xuan Zhang

(57) ABSTRACT

The present application discloses a semiconductor device. The semiconductor device includes a package structure including a first side and a second side opposite to the first side; an interposer structure positioned over the first side of the package structure; a first die positioned over the interposer structure; a second die positioned over the interposer structure; and a plurality of middle interconnectors positioned between the first side of the package structure and the first die and between the first side of the package structure and the second die. The plurality of middle interconnectors respectively includes a middle exterior layer positioned between the first side of the package structure and the interposer structure, a middle interior layer enclosed by the middle exterior layer, and a cavity enclosed by the interposer structure, the package structure, and the middle interior layer.

4 Claims, 33 Drawing Sheets

(51) Int. Cl.
*H01L 25/00* (2006.01)
*H01L 25/065* (2023.01)
*H01L 25/18* (2023.01)
*H01L 23/00* (2006.01)

(52) U.S. Cl.
CPC ............... *H01L 2224/05555* (2013.01); *H01L 2224/05563* (2013.01); *H01L 2224/13111* (2013.01); *H01L 2224/13139* (2013.01); *H01L 2224/16055* (2013.01); *H01L 2224/16057* (2013.01); *H01L 2224/16227* (2013.01); *H01L 2224/73204* (2013.01)

(56) References Cited

U.S. PATENT DOCUMENTS

| | | | |
|---|---|---|---|
| 2014/0319681 A1* | 10/2014 | Maohua | H01L 23/3736 257/738 |
| 2015/0035142 A1* | 2/2015 | Kim | H01L 23/49822 257/737 |
| 2019/0378797 A1 | 12/2019 | Nam et al. | |
| 2022/0367310 A1 | 11/2022 | Lee et al. | |

\* cited by examiner

SEMICONDUCTOR DEVICE WITH COMPOSITE MIDDLE INTERCONNECTORS

CROSS-REFERENCE TO RELATED APPLICATION

This application is a divisional application of U.S. Non-Provisional application Ser. No. 17/560,608 filed 23 Dec. 2021, which is incorporated herein by reference in its entirety.

TECHNICAL FIELD

The present disclosure relates to a semiconductor device, and more particularly, to a semiconductor device with composite middle interconnectors.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of middle interconnectors positioned between the first side of the package structure and the first die and between the first side of the package structure and the second die. The plurality of middle interconnectors topographically aligned with the first die include a first density. The plurality of middle interconnectors topographically aligned with the second die include a second density different from the first density.

Another aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of bottom interconnectors positioned on the second side of the package structure, and respectively including: a bottom exterior layer positioned on the second side of the package structure; and a cavity enclosed by the bottom exterior layer.

Another aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of bottom interconnectors positioned on the second side of the package structure, and respectively including: a bottom exterior layer positioned on the second side of the package structure; a bottom interior layer enclosed by the bottom exterior layer; and a cavity enclosed by the bottom interior layer.

Due to the design of the semiconductor device of the present disclosure, the different density of the middle interconnectors may allow more flexible design rules. In addition, the cavities of the middle interconnectors and the bottom interconnectors may neutralize and reduce the potential destructive stress forces during fabricating or operating the semiconductor device. As a result, the yield and the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
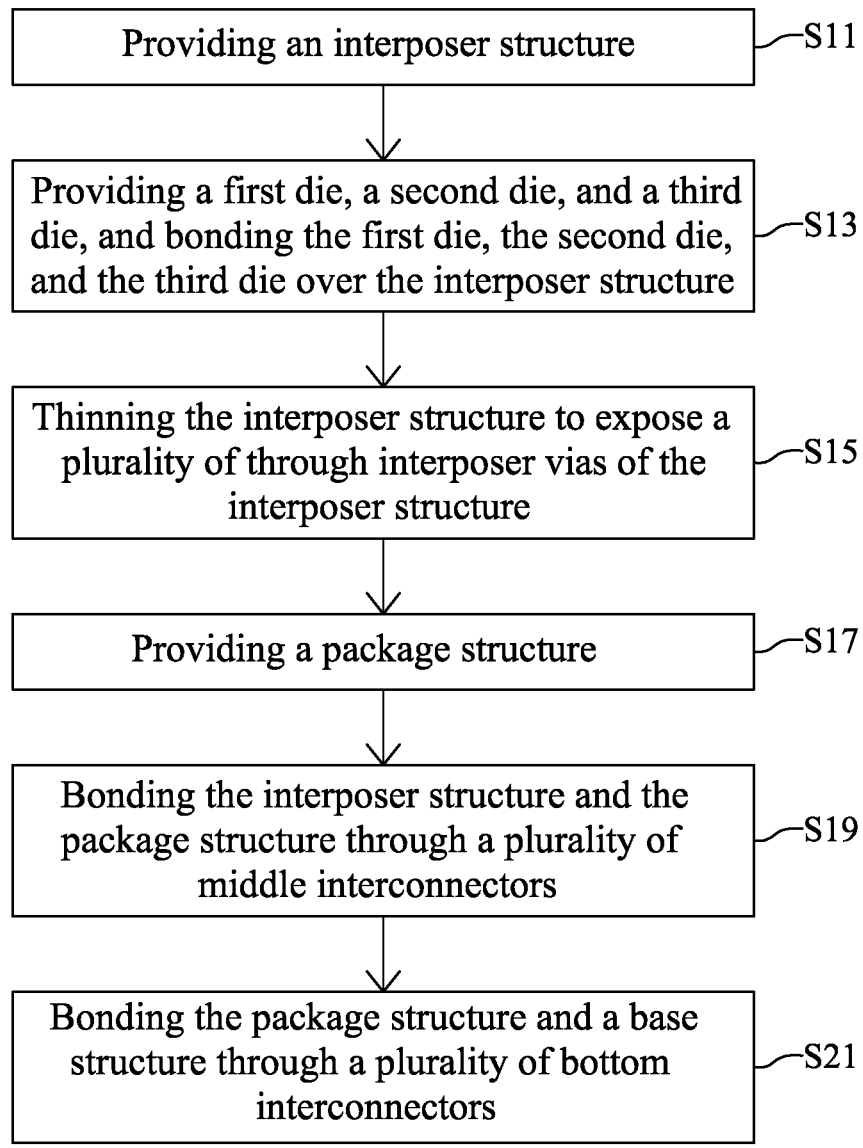
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
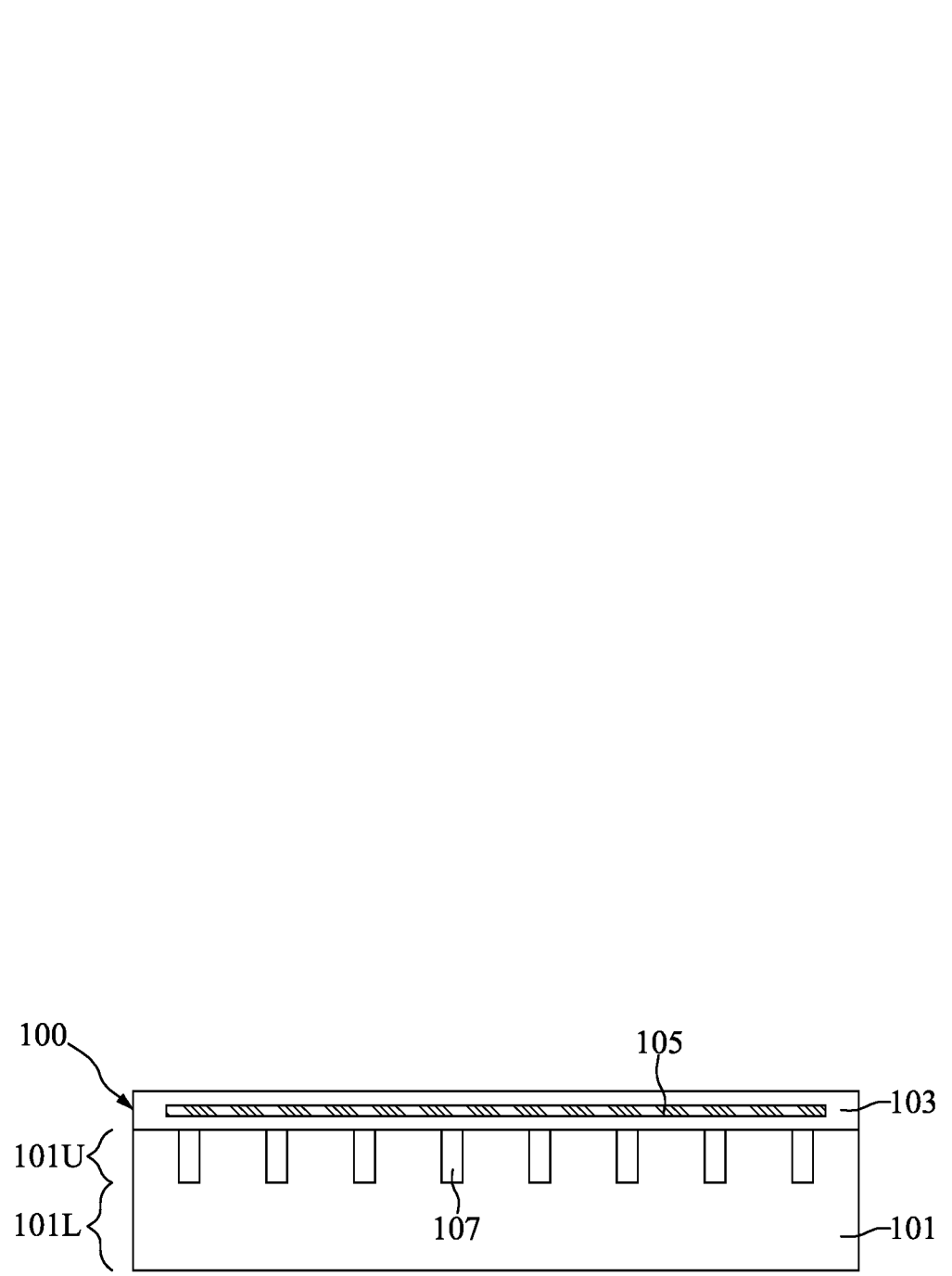
FIG. 2 illustrates, in a schematic cross-sectional view diagram, part of a flow for fabricating the semiconductor device in accordance with one embodiment of the present disclosure.
Figure 3:
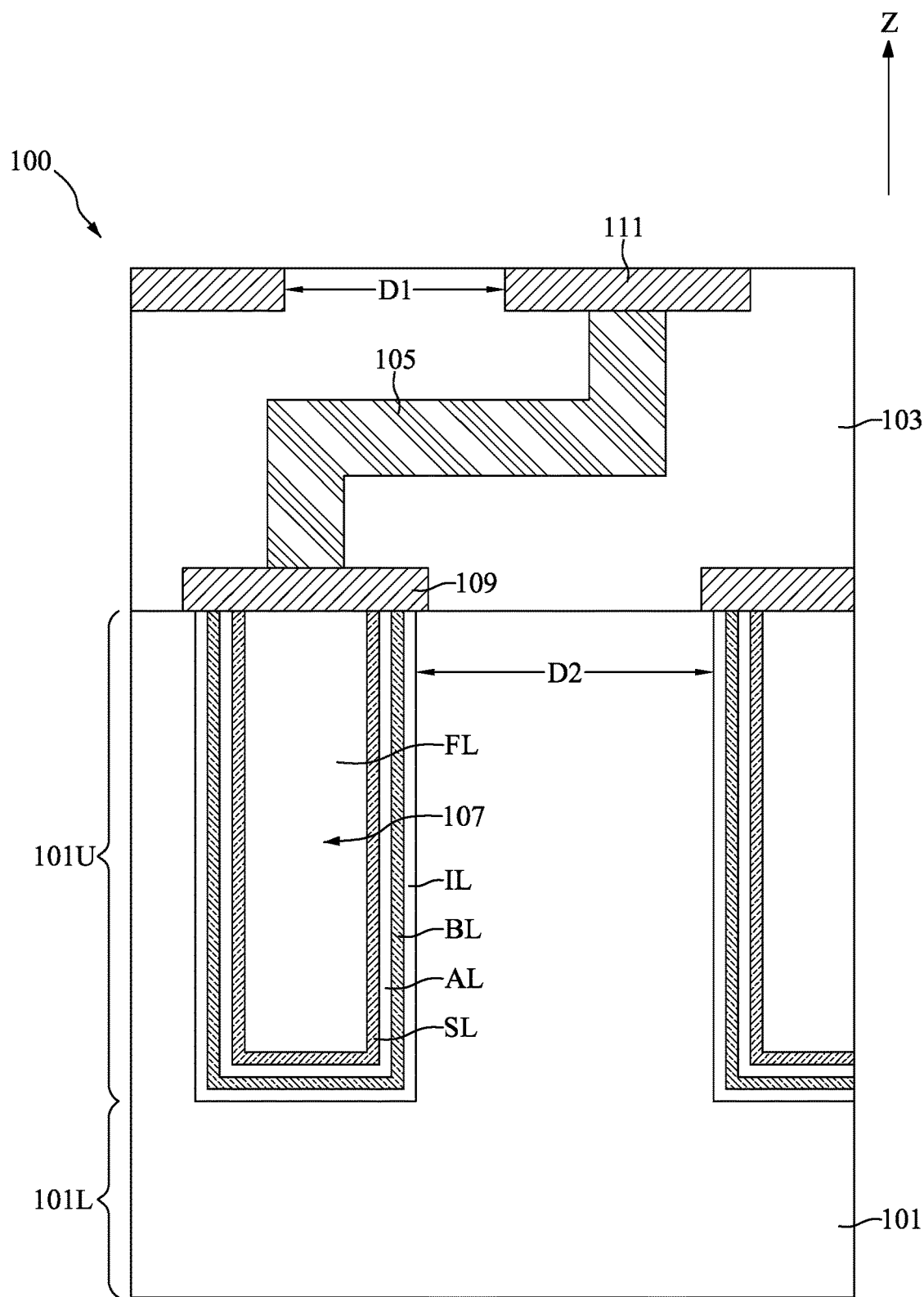
FIG. 3 is a close-up schematic cross-sectional view diagram of FIG. 2.

FIG. 1 illustrates, in a flowchart diagram form, a method 10 for fabricating a semiconductor device 1A in accordance with one embodiment of the present disclosure. FIG. 2 illustrates, in a schematic cross-sectional view diagram, part of a flow for fabricating the semiconductor device 1A in accordance with one embodiment of the present disclosure. FIG. 3 is a close-up schematic cross-sectional view diagram of FIG. 2.

With reference to FIGS. 1 to 3, at step S11, an interposer structure 100 may be provided.

With reference to FIGS. 2 and 3, in some embodiments, the interposer structure 100 may be provided at wafer level. The interposer structure 100 provided at wafer level may then be sawed into dies to form interposer dies. Alternatively, in the present embodiment, the interposer structure 100 may be provided at the chip level.

With reference to FIG. 2, the interposer structure 100 may include an interposer substrate 101, an interposer insulating layer 103, an interposer wiring pattern 105, and a plurality of through interposer vias 107.

In some embodiments, the interposer substrate 101 may be formed of a semiconductor, such as silicon (which may be crystalline silicon), germanium, silicon-germanium, gallium-arsenic, glass, ceramic, or semiconductor on insulator structure (e.g., silicon on insulator, which may be amorphous, polycrystalline or crystalline silicon formed on glass). The interposer substrate 101 may be formed of undoped material. Alternatively, the interposer substrate 101 may be formed of a rigid material, having a Young's modulus of 100 GPa or more. The interposer substrate 101 may have a smooth and/or flat surface. For example, the rms (root mean square) surface roughness of the interposer substrate 101 may be 1.5 nm or less.

In some embodiments, the interposer substrate 101 may include a lower portion 101L and an upper portion 101U formed on the lower portion 101L. The upper portion 101U may include the through interposer vias 107 buried into the upper portion 101U. The through interposer vias 107 may not extend into the lower portion 101L. The lower portion 101L may be removed during a following semiconductor process, for example, during a thinning process. With the removal of the lower portion 101L, the through interposer vias 107 may extend through the upper portion 101U.

With reference to FIG. 2, the interposer insulating layer 103 may be formed on the interposer substrate 101. The interposer wiring pattern 105 may be formed in the interposer insulating layer 103. The interposer wiring pattern 105 may be electrically connected to the through interposer vias 107 (as shown in FIG. 3). In some embodiments, the interposer insulating layer 103 may include oxide, nitride, or oxynitride, for example, silicon oxide, silicon nitride, silicon oxynitride, or silicon nitride oxide. In some embodiments, the interposer wiring pattern 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the interposer wiring pattern 105 may be a re-wiring pattern. In some embodiments, some or all of the through interposer vias 107 may be formed to penetrate the interposer insulating layer 103 so that the through interposer vias 107 may be exposed from the top surface of the interposer insulating layer 103 (not shown).

With reference to FIGS. 2 and 3, the interposer structure 100 may include a plurality of interposer bottom pads 109 and a plurality of interposer top pads 111. It should be noted that only some of the interposer bottom pads 109 and some of the interposer top pads 111 are shown for clarity. The interposer bottom pads 109 may be positioned in the interposer insulating layer 103, substantially coplanar with the bottom surface of the interposer insulating layer 103, and electrically connected to the interposer wiring pattern 105. The interposer top pads 111 may be positioned in the interposer insulating layer 103, substantially coplanar with the top surface of the interposer insulating layer 103, and electrically connected to the interposer wiring pattern 105.

In some embodiments, the interposer top pads 111 may be more densely arranged than the through interposer vias 107. For example, a horizontal distance D1 between the interposer top pads 111 may be smaller than a horizontal distance D2 between the through interposer vias 107. In this case, the interposer wiring pattern 105 may serve as the re-wiring pattern.

In some embodiments, the interposer bottom pads 109 and the interposer top pads 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

For brevity, clarity, and convenience of description, only one through interposer via 107 is described. In some embodiments, the through interposer via 107 may include a filler layer FL, a seed layer SL, an adhesion layer AL, a barrier layer BL, and an isolation layer IL.

In some embodiments, the filler layer FL may be formed buried in upper portion 101U of the interposer substrate 101. The filler layer FL may be formed of, for example, doped polysilicon, tungsten, copper, carbon nanotube, or solder alloy.

In some embodiments, the isolation layer IL may be formed between the filler layer FL and the interposer substrate 101. The isolation layer IL may have a U-shaped cross-sectional profile. In some embodiments, the isolation layer IL may be formed of, for example, silicon oxide, silicon nitride, silicon oxynitride, or tetra-ethyl ortho-silicate. The isolation layer IL may have a thickness between about 50 nm and about 200 nm. In some embodiments, the isolation layer IL may be formed of, for example, parylene, epoxy, or poly(p-xylene). The isolation layer IL may have a thickness between about 1 μm and about 5 μm. The isolation layer IL may ensure the filler layer FL is electrically isolated in the interposer substrate 101.

In some embodiments, the seed layer SL may have a U-shaped cross-sectional profile. The seed layer SL may be formed between the filler layer FL and the isolation layer IL. In some embodiments, the seed layer SL may have a thickness between about 10 nm and about 40 nm. In some embodiments, the seed layer SL may include, for example, at least one selected from the group consisting of aluminum, gold, beryllium, bismuth, cobalt, copper, hafnium, indium, manganese, molybdenum, nickel, lead, palladium, platinum, rhodium, rhenium, lutetium, tantalum, tellurium, titanium, tungsten, zinc, and zirconium. The seed layer SL may reduce a resistivity of an opening during the formation of the filler layer FL.

In some embodiments, the adhesion layer AL may have a U-shaped cross-sectional profile. The adhesion layer AL may be formed between the seed layer SL and isolation layer IL. The seed layer SL may be formed of, for example, titanium, tantalum, titanium tungsten, or manganese nitride. The seed layer SL may improve an adhesion between the seed layer SL and the barrier layer BL.

In some embodiments, the barrier layer BL may have a U-shaped cross-sectional profile. The barrier layer BL may be between the adhesion layer AL and the isolation layer IL. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the interposer substrate 101.

In some embodiments, the filler layer FL, the seed layer SL, the adhesion layer AL, the barrier layer BL, and the isolation layer IL may be formed by, for example, chemical vapor deposition, plasma enhanced chemical vapor deposition, high-density plasma chemical vapor deposition, sputtering, metal organic chemical vapor deposition, atomic layer deposition, or other applicable deposition process.

In some embodiments, the interposer bottom pads 109 may be optional. That is, the interposer wiring pattern 105 may be directly disposed on the through interposer via 107 and electrically connect to the through interposer via 107.

Figure 4:
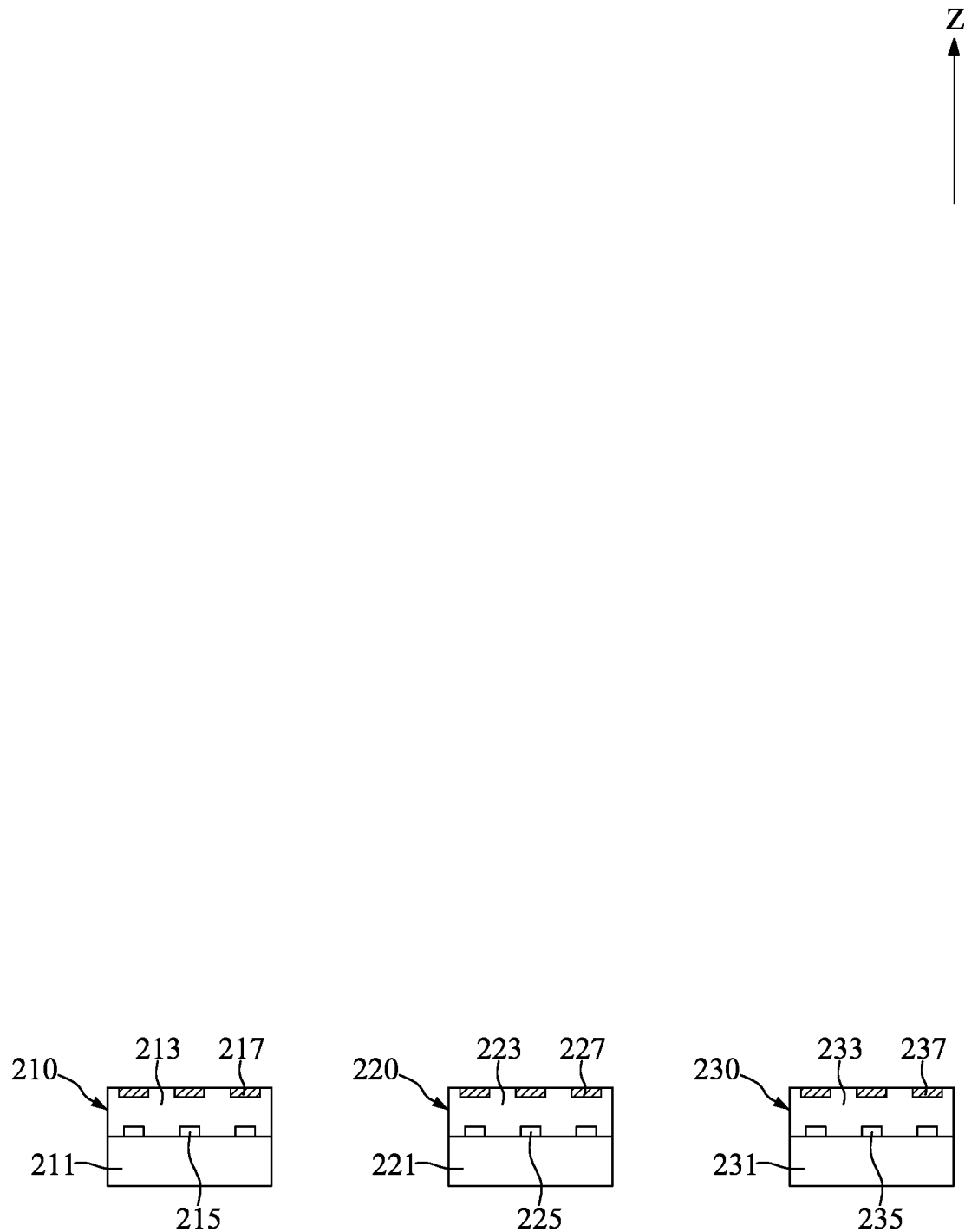
FIGS. 4 and 5 illustrate, in schematic cross-sectional view diagrams, part of the flow for fabricating the semiconductor device in accordance with one embodiment of the present disclosure.
Figure 5:
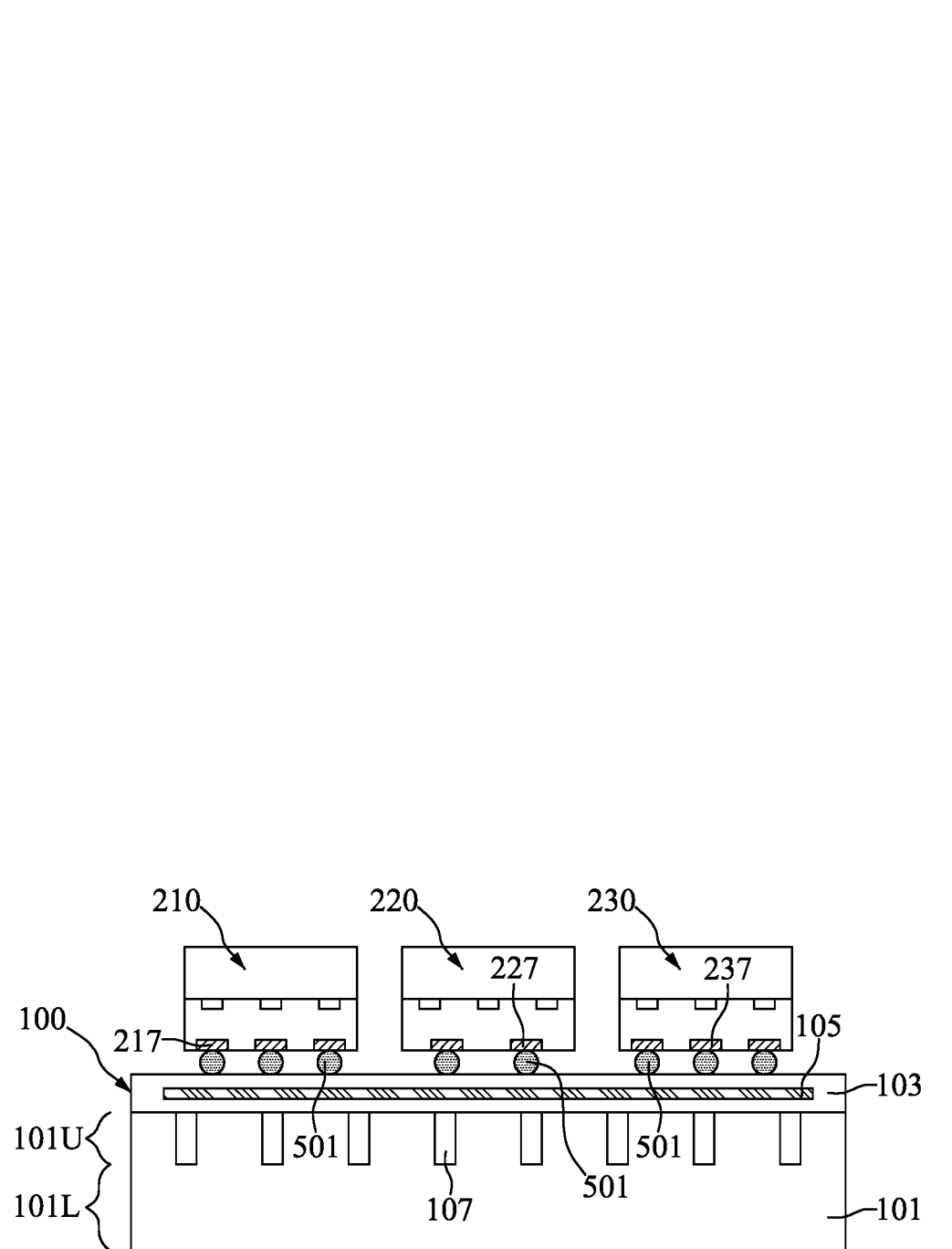
Figure 6:
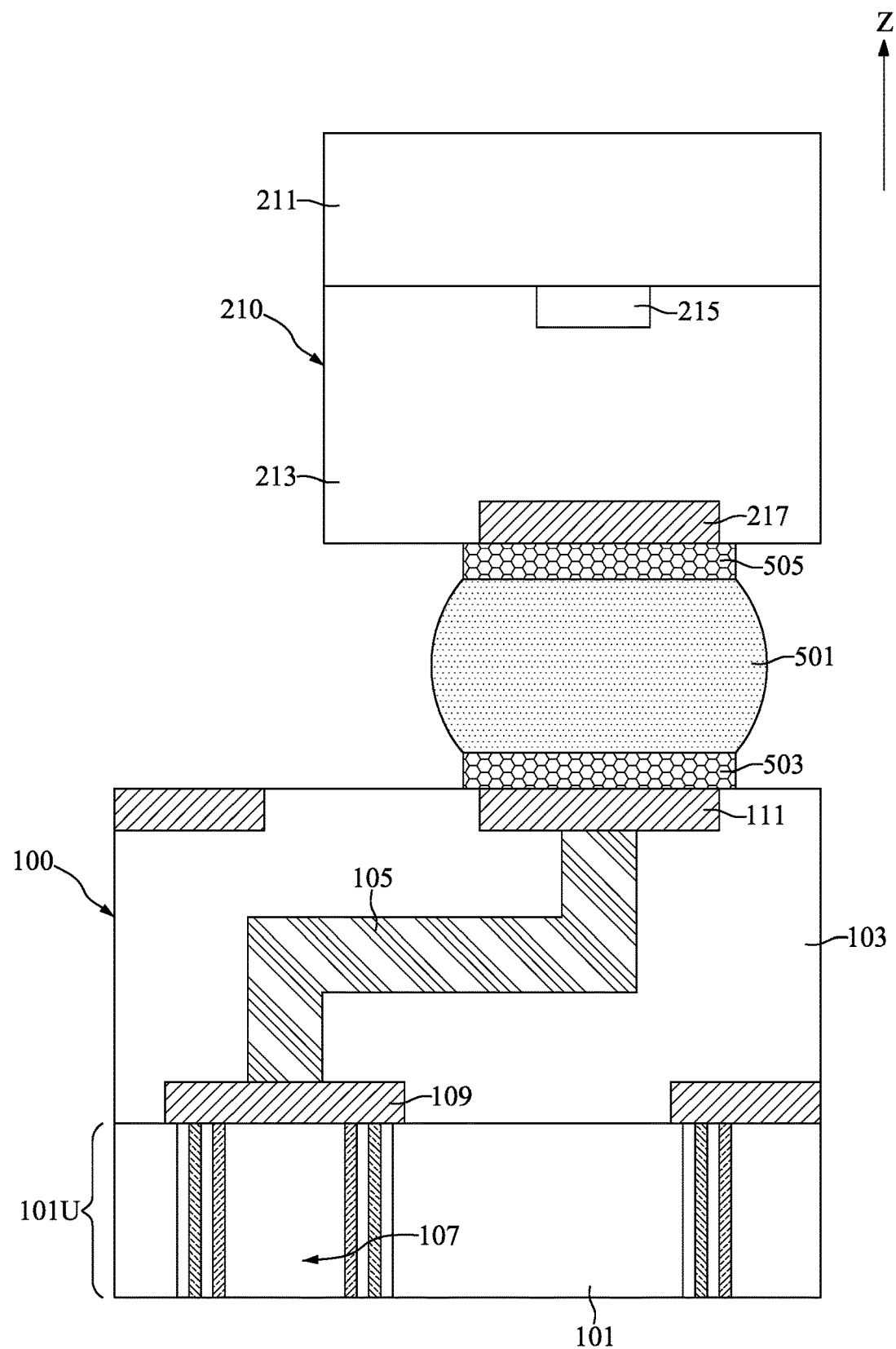
FIG. 6 is a close-up schematic cross-sectional view diagram of FIG. 5.
Figure 7:
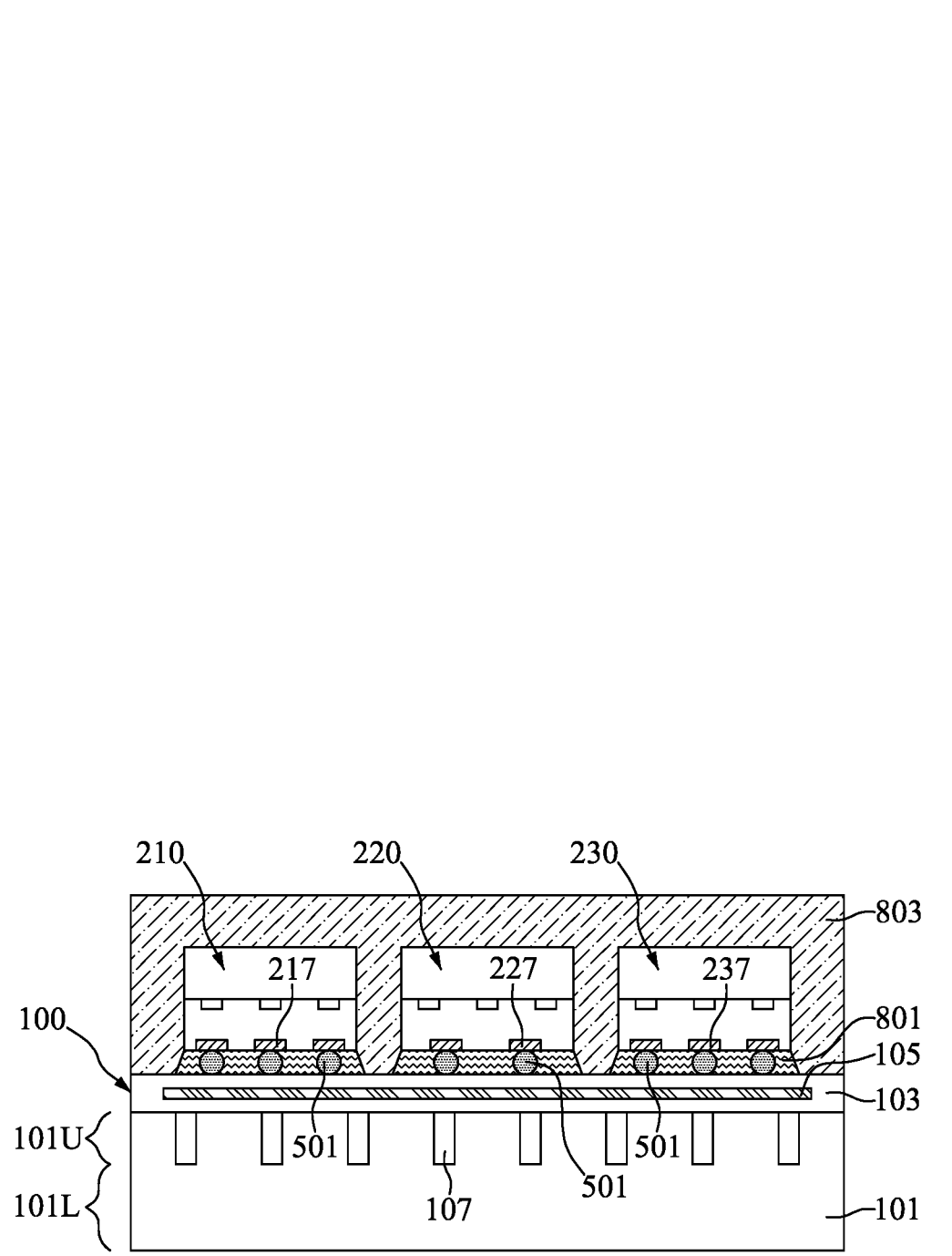
FIG. 7 illustrates, in a schematic cross-sectional view diagram, part of the flow for fabricating the semiconductor device in accordance with one embodiment of the present disclosure.
Figure 8:
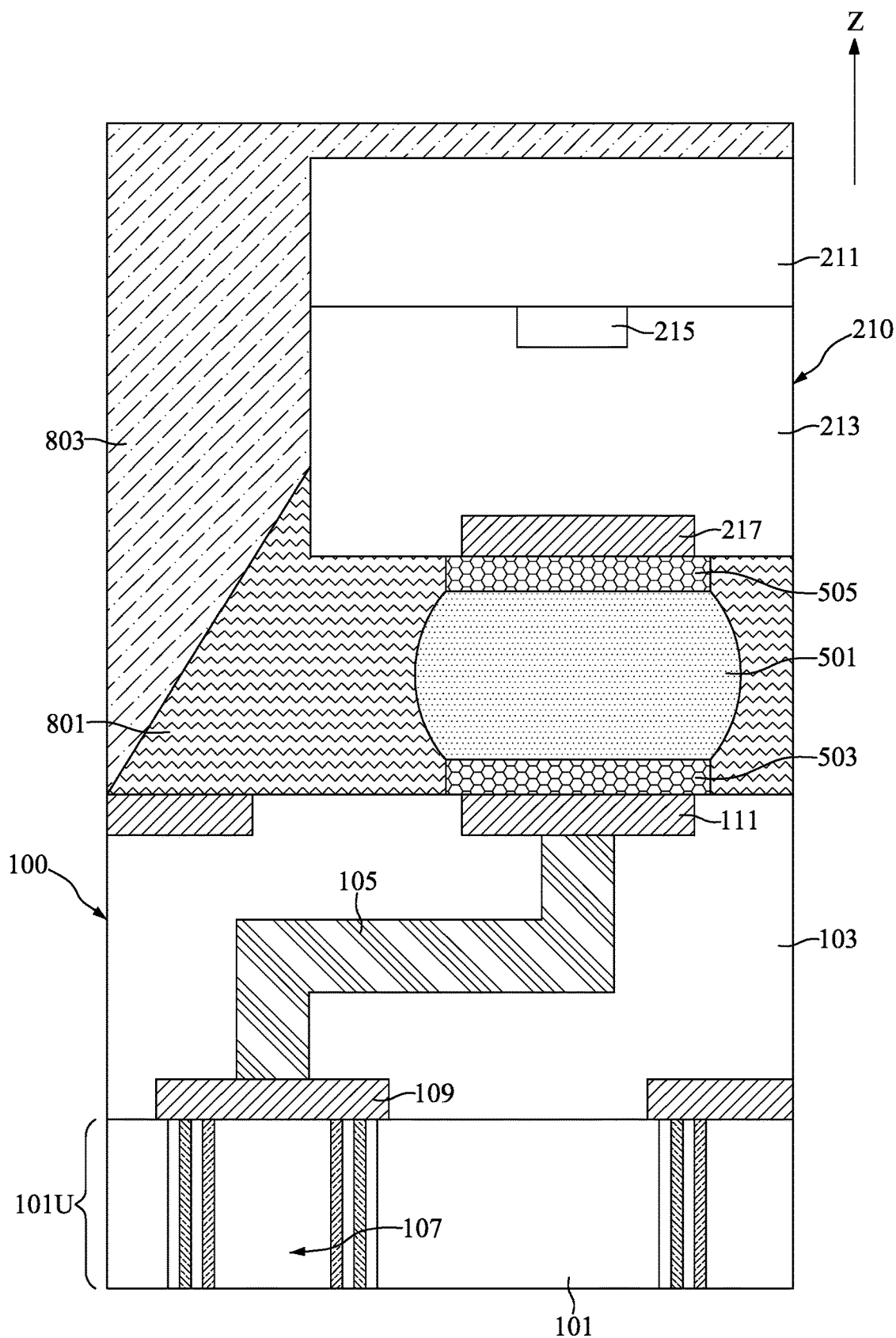
FIG. 8 is a close-up schematic cross-sectional view diagram of FIG. 7.

FIGS. 4 and 5 illustrate, in schematic cross-sectional view diagrams, part of the flow for fabricating the semiconductor device 1A in accordance with one embodiment of the present disclosure. FIG. 6 is a close-up schematic cross-sectional view diagram of FIG. 5. FIG. 7 illustrates, in a schematic cross-sectional view diagram, part of the flow for fabricating the semiconductor device 1A in accordance with one embodiment of the present disclosure. FIG. 8 is a close-up schematic cross-sectional view diagram of FIG. 7.

With reference to FIG. 1 and FIGS. 4 to 8, at step S13, a first die 210, a second die 220, and a third die 230 may be provided, and the first die 210, the second die 220, and the third die 230 may be bonded over the interposer structure 100.

With reference to FIG. 4, the first die 210 may include a first substrate 211, a first dielectric layer 213, a plurality of first device elements 215, and a plurality of first conductive features.

In some embodiments, the first substrate 211 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the plurality of first device elements 215 may be formed on the first substrate 211. Some portions of the first device elements 215 may be formed in the first substrate 211. The first device elements 215 may be transistors such as complementary metal-oxide-semiconductor transistors, metal-oxide-semiconductor field-effect transistors, fin field-effect-transistors, the like, or a combination thereof.

In some embodiments, the first dielectric layer 213 may be formed on the first substrate 211. The first dielectric layer 213 may be a stacked layer structure. The first dielectric layer 213 may include a plurality of insulating sub-layers. Each of the insulating sub-layers may have a thickness between about 0.5 pin and about 3.0 pin. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The low-k dielectric materials may have a dielectric constant less than 3.0 or even less than 2.5. In some embodiments, the low-k dielectric materials may have a dielectric constant less than 2.0. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the first conductive features may be formed in the first dielectric layer 213. The first conductive features may include first conductive lines (not shown), first conductive vias (not shown), and first conductive pads 217. The first conductive lines may be separated from each other and may be horizontally disposed in the first dielectric layer 213 along the direction Z. In the present embodiment, the topmost first conductive lines may be designated as the first conductive pads 217. The top surfaces of the first conductive pads 217 and the top surface of the first dielectric layer 213 may be substantially coplanar. The first conductive vias may connect adjacent first conductive lines along the direction Z, adjacent first device element 215 and first conductive line, and adjacent first conductive pad 217 and first conductive line. In some embodiments, the first conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first conductive features may be formed during the formation of the first dielectric layer 213.

In some embodiments, the first device elements 215 and the first conductive features may together configure functional units of the first die 210. A functional unit, in the description of the present disclosure, generally refers to functionally related circuitry that has been partitioned for functional purposes into a distinct unit. In some embodiments, the functional units of the first die 210 may include, for example, highly complex circuits such as processor cores, memory controllers, or accelerator units. In some embodiments, the functional units of the first die 210 may include control circuit and high-speed circuitry that are associated with the second die 220 which will be illustrated later. In some embodiments, the first die 210 may be configured as a logic die.

With reference to FIG. 4, the second die 220 may include a second substrate 221, a second dielectric layer 223, a plurality of second device elements 225, and a plurality of second conductive features including second conductive pads 227. The second substrate 221, the second dielectric layer 223, the second device elements 225, and the second conductive features may be formed of structures/materials similar to the first substrate 211, the first dielectric layer 213, the first device elements 215, and the first conductive features, respectively and correspondingly, and descriptions thereof are not repeated herein.

In some embodiments, the second conductive features may include storage units (not shown) formed in the second dielectric layer 223. Each of the storage units may include an insulator-conductor-insulator structure and may be electrically coupled to the corresponding second conductive pad 227 and the corresponding second device element 225, respectively and correspondingly. In some embodiments, the second device elements 225, the second conductive features may together configure functional units of the second die 220. In some embodiments, the functional units of the second die 220 may include storage circuitry, control circuit, and high-speed circuitry. In some embodiments, the second die 220 may be configured as a memory die. In some embodiments, the second die 220 may be configured as a logic die.

In some embodiments, the functional units of the second die 220 may only include core storage circuitry such as I/O and clocking circuit. The functional units of the second die 220 may not include any control circuit or high-speed circuitry. In such situation, the second die 220 may cooperate with the first die 210 including control circuit and/or high-speed circuitry.

With reference to FIG. 4, the third die 230 may include a third substrate 231, a third dielectric layer 233, a plurality of third device elements 235, and a plurality of third conductive features including third conductive pads 237. The third substrate 231, the third dielectric layer 233, the third device elements 235, and the third conductive features may be formed of structures/materials similar to the first substrate 211, the first dielectric layer 213, the first device elements 215, and the first conductive features, respectively and correspondingly, and descriptions thereof are not repeated herein. In some embodiments, the third die 230 may be configured to perform analog related processing. In some embodiments, the third die 230 may be configured as a logic die or a memory die.

With reference to FIG. 5, the first die 210, the second die 220, and the third die 230 may be sequentially bonded onto the interposer structure 100 through a plurality of top interconnectors 501 by flip chip bonding processes. For brevity, clarity, and convenience of description, only one top interconnector 501 is described. In some embodiments, the top interconnector 501 may be a micro-bump and may include lead, tin, indium, bismuth, antimony, silver, gold, copper, nickel, or alloy thereof.

With reference to FIGS. 5 and 6, a lower bonding pad 503 may be formed on the corresponding interposer top pad 111 and electrically connected to the corresponding interposer top pad 111. An upper bonding pad 505 may be formed under the corresponding first conductive pad 217 and electrically connected to the corresponding first conductive pad 217. The top interconnector 501 may be formed between the lower bonding pad 503 and the upper bonding pad 505. In some embodiments, the top interconnector 501 may be a solder ball, and may be attached to the lower bonding pad 503 and/or the upper bonding pad 505 by using a thermal compression process and/or a reflow process.

With reference to FIGS. 5 and 6, the functional units of the first die 210, the first die 210, and the third die 230 may be electrically coupled to the through interposer via 107 through the top interconnector 501 and the interposer wiring pattern 105. As a result, the first die 210, the second die 220, and the third die 230 may cooperate to each other.

With reference to FIGS. 7 and 8, top underfill layers 801 may be filled between the first die 210 and the interposer insulating layer 103, between the second die 220 and the interposer insulating layer 103, and between the third die 230 and the interposer insulating layer 103. The top underfill layers 801 may surround the top interconnectors 501. In some embodiments, the top underfill layers 801 may also seal a portion of the lateral surfaces (e.g., side surfaces) of the dies 210, 220, 230.

In some embodiments, the top underfill layers 801 may be formed by curing an underfill material which is made up of a cross-linked organic resin and low Coefficient of Thermal Expansion (CTE) inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The top underfill layers 801 may tightly adhere to the dies 210, 220, and 230, the top interconnectors 501, and the interposer structure 100 so as to the top underfill layers 801 may redistribute the stresses and strains from the CTE mismatch and mechanical shock over the dies 210, 220, 230. As a result, crack initiation and growth in the top interconnectors 501 may be either prevented or drastically reduced. In addition, the top underfill layers 801 may provide protection to the top interconnectors 501 to improve mechanical integrity of the configuration of the interposer structure 100 and the dies 210, 220, 230. Furthermore, the top underfill layers 801 may provide partial protection against moisture ingress, and other forms of contamination.

With reference to FIGS. 7 and 8, the top molding layer 803 may be formed to cover the dies 210, 220, 230, and the top surface of the interposer insulating layer 103. The top molding layer 803 may be formed of a molding compound such as polybenzoxazole, polyimide, benzocyclobutene, epoxy laminate, or ammonium bifluoride. The top molding layer 803 may be formed by compressive molding, transfer molding, liquid encapsulent molding, and the like. For example, a molding compound may be dispensed in liquid form. Subsequently, a curing process is performed to solidify the molding compound. The formation of molding compound may overflow the dies 210, 220, 230 so that molding compound covers the dies 210, 220, 230.

Figure 15:
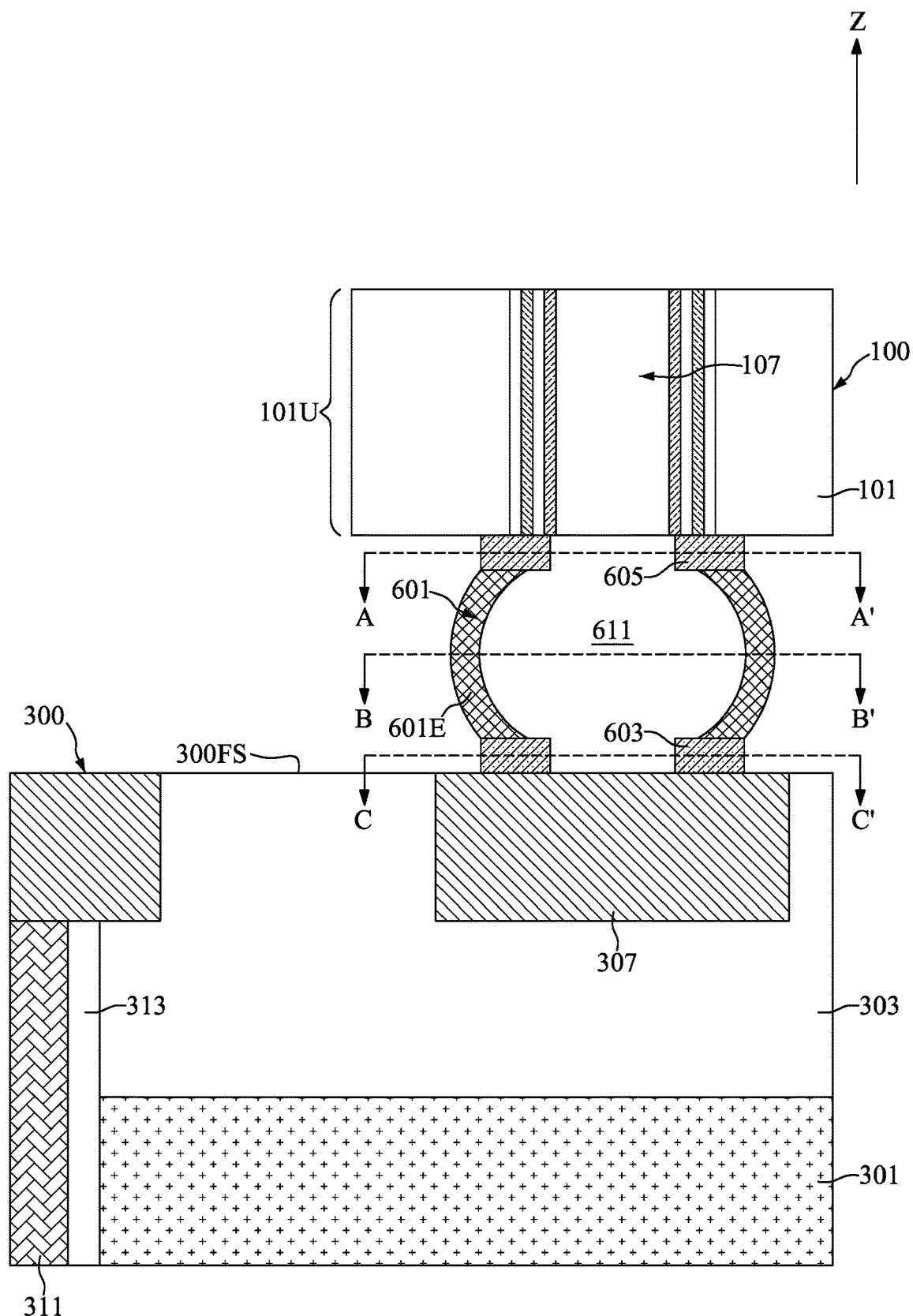
FIG. 15 is a close-up schematic cross-sectional view diagram of FIG. 14.
Figure 16:
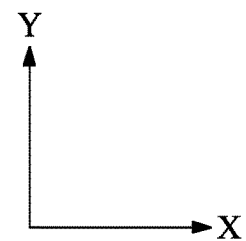
FIG. 16 is a schematic cross-sectional view diagram taken along lines A-A', B-B', and C-C' in FIG. 15.
Figure 16:
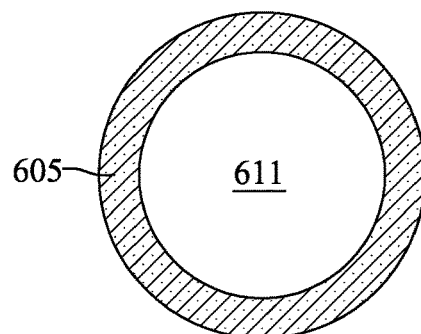
Figure 16:
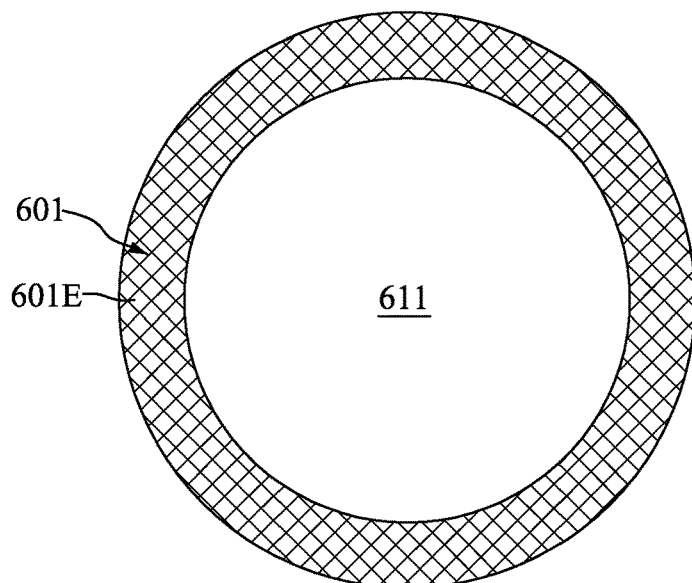
Figure 16:
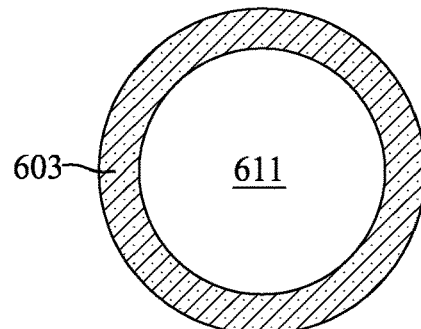
Figure 17:
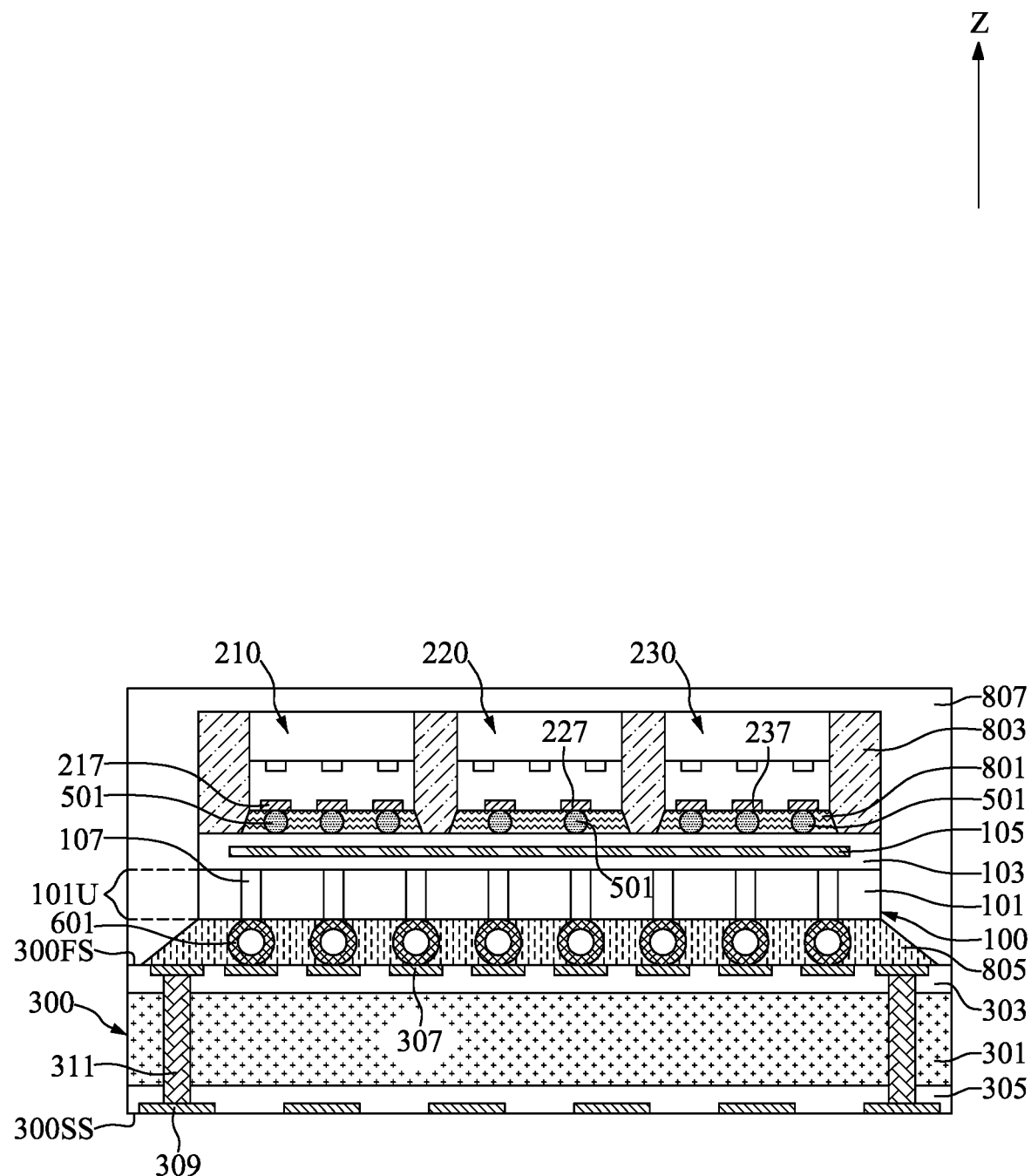
FIG. 17 illustrates, in a schematic cross-sectional view diagram, part of the flow for fabricating the semiconductor device in accordance with one embodiment of the present disclosure.
Figure 18:
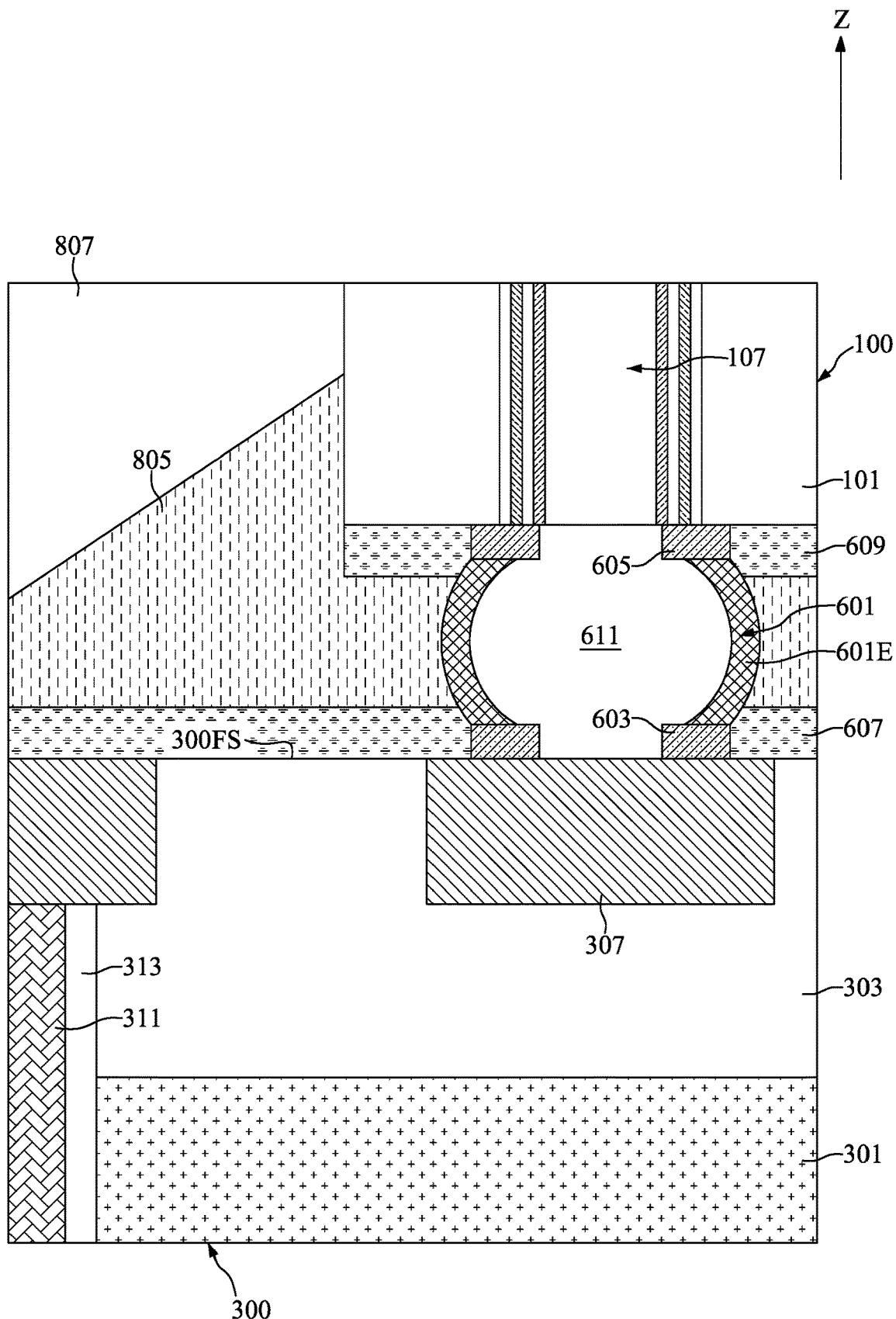
FIG. 18 is a close-up schematic cross-sectional view diagram of FIG. 17.

FIGS. 9 to 14 illustrate, in schematic cross-sectional view diagrams, part of the flow for fabricating the semiconductor device 1A in accordance with one embodiment of the present disclosure. FIG. 15 is a close-up schematic cross-sectional view diagram of FIG. 14. FIG. 16 is a schematic cross-sectional view diagram taken along lines A-A', B-B', and C-C' in FIG. 15. FIG. 17 illustrates, in a schematic cross-sectional view diagram, part of the flow for fabricating the semiconductor device 1A in accordance with one embodiment of the present disclosure. FIG. 18 is a close-up schematic cross-sectional view diagram of FIG. 17.

With reference to FIG. 1 and FIGS. 9 to 12, at step S15, the interposer structure 100 may be thinned to expose the plurality of through interposer vias 107 of the interposer structure 100.

Figure 9:
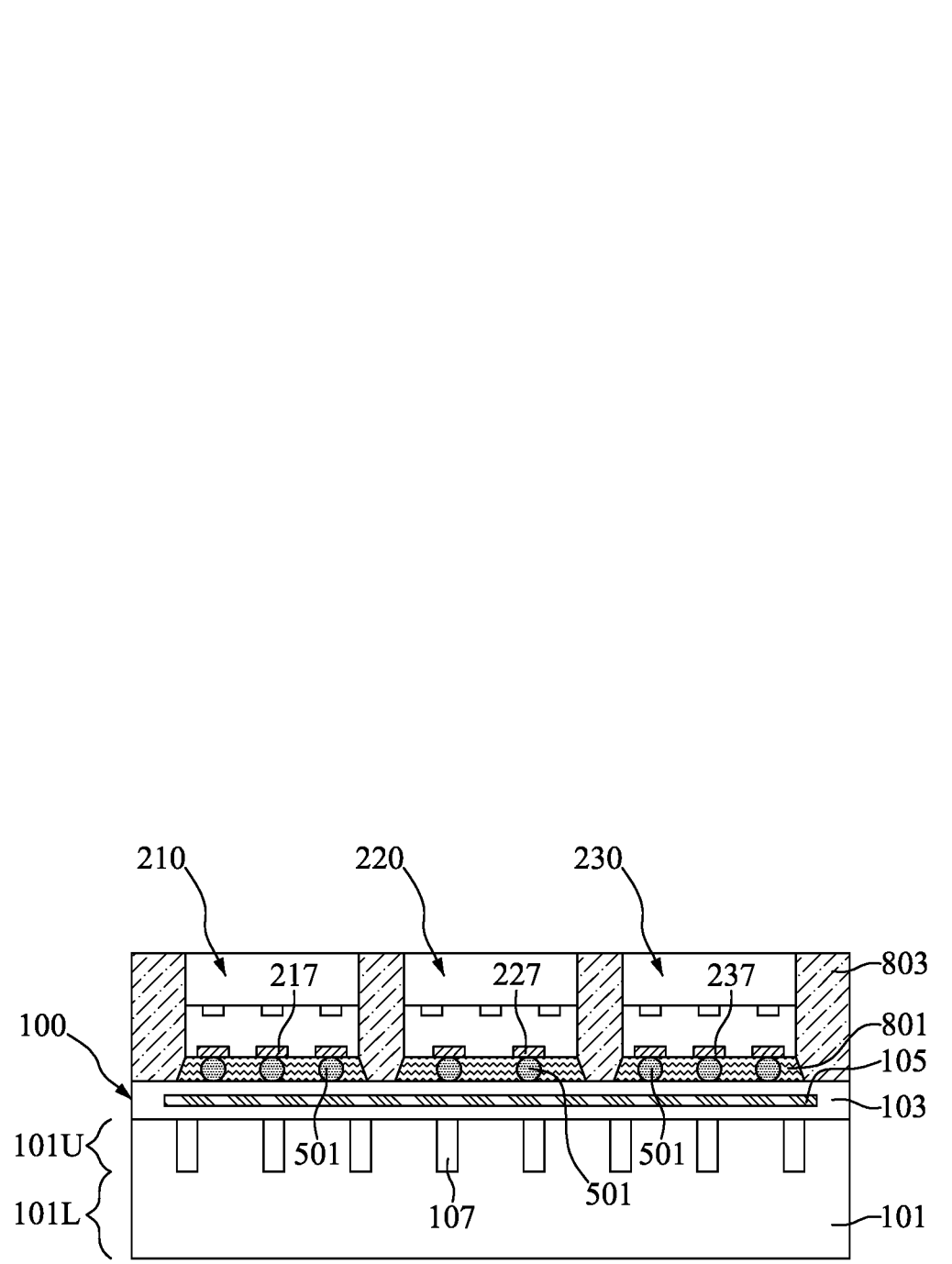
FIGS. 9 to 14 illustrate, in schematic cross-sectional view diagrams, part of the flow for fabricating the semiconductor device in accordance with one embodiment of the present disclosure.

With reference to FIG. 9, a planarization process such as mechanical grinding, chemical mechanical polish, or other etch back technique may be employed to remove excess portions of the top molding layer 803 and provide a substantially flat surface. The dies 210, 220, 230 may be exposed after the planarization process.

Figure 10:
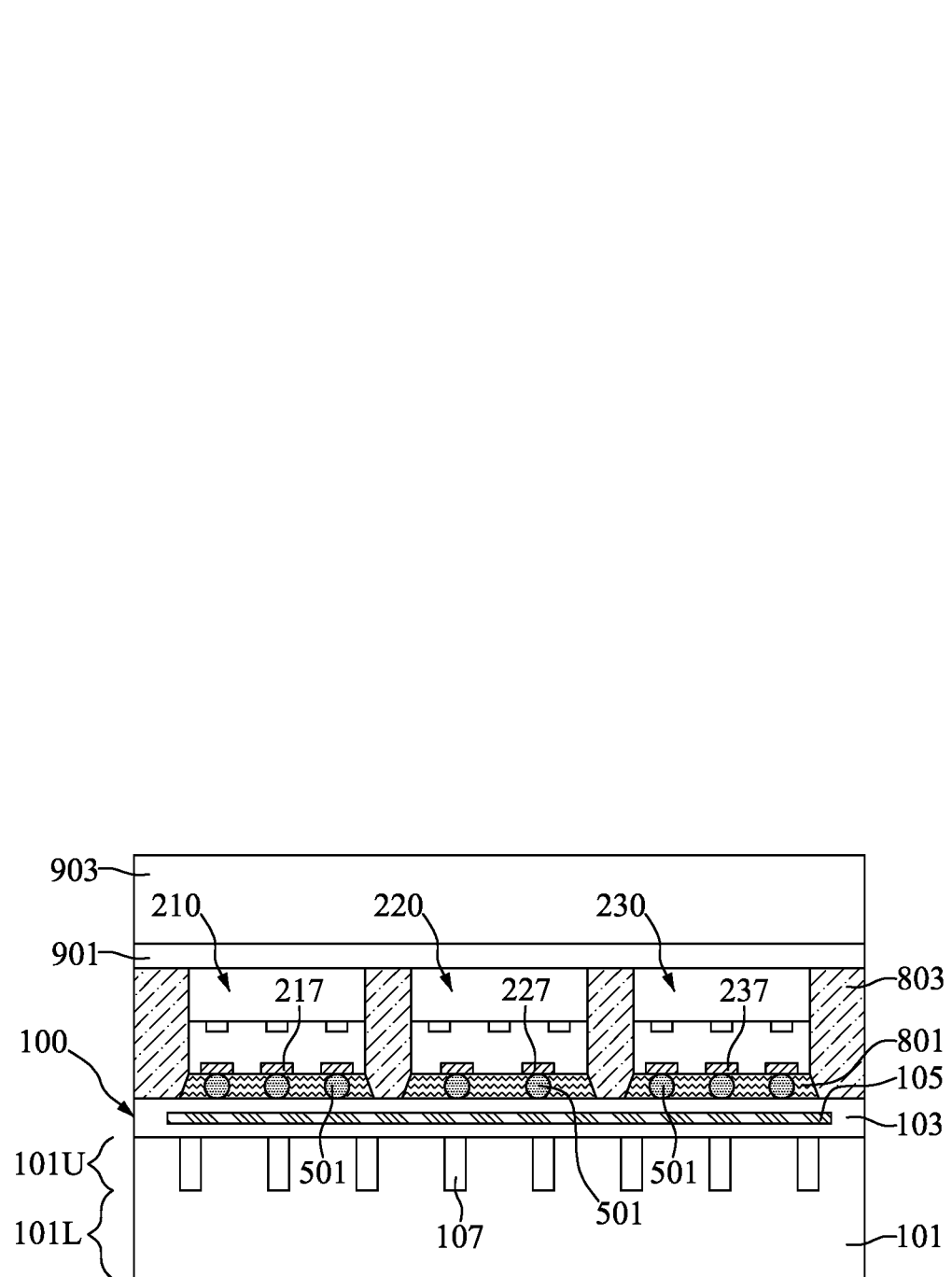

With reference to FIG. 10, an auxiliary substrate 903 may be attached on the top molding layer 803 and the dies 210, 220, 230 with the assistance of an attachment layer 901. In some embodiments, the attachment may include an operation of forming the attachment layer 901 on the top surfaces of the dies 210, 220, 230, and an operation of attaching the auxiliary substrate 903 onto the attachment layer 901. The auxiliary substrate 903 may have a size extending over the dies 210, 220, 230.

In some embodiments, the auxiliary substrate 903 may be formed of a rigid material, and include metal, glass, ceramic, or the like. The attachment layer 901 may be an adhesive tape or an adhesive solution. In some embodiments, the attachment layer 901 may be die attach film, silver paste, or the like. In some embodiments, the attachment layer 901 may further include gold, silver, alumina, or boron nitride particles.

Figure 11:
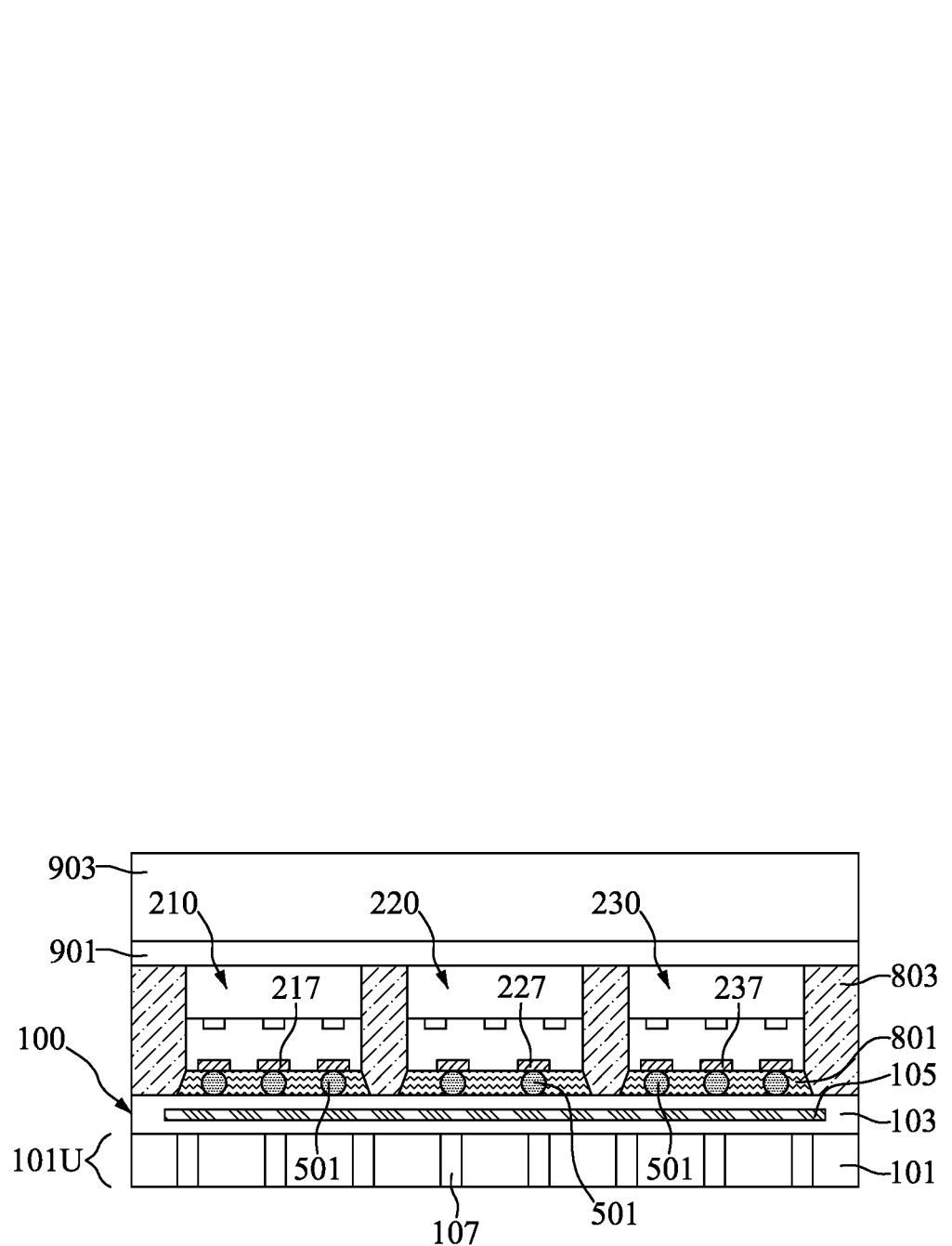

With reference to FIG. 11, the lower portion 101L of the interposer substrate 101 may be removed so that the through interposer vias 107 may be exposed at the bottom surface of the interposer substrate 101. The removal may be performed by using wafer grinding, mechanical abrasion, polishing, or the like, or using chemical removal, such as a wet etch. In the present operation, the auxiliary substrate 903 may have such a sufficient thickness that the interposer structure 100 is not deformed, and the interposer structure 100 may function as a carrier substrate for movement to a subsequent processing equipment.

Figure 12:
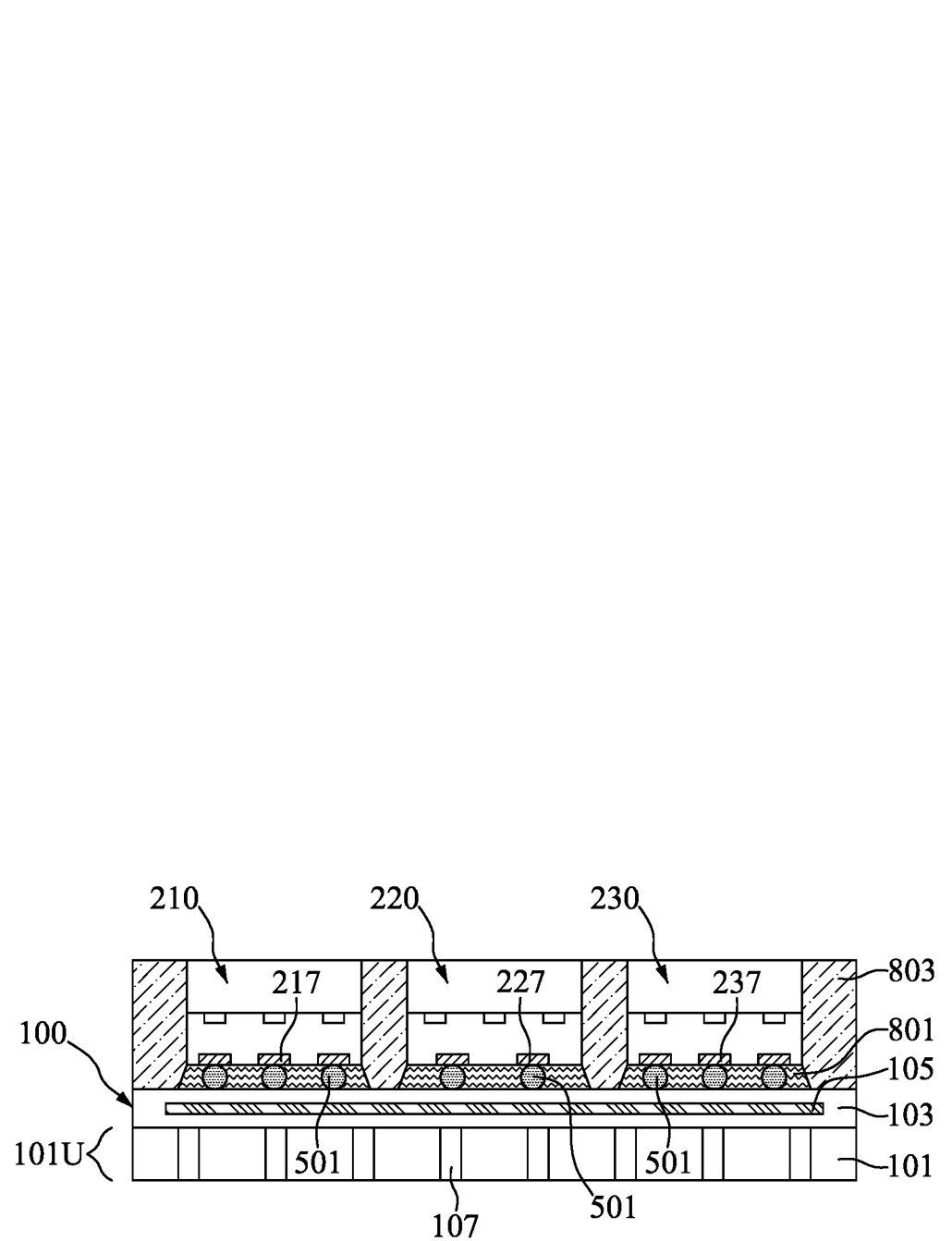

With reference to FIG. 12, the auxiliary substrate 903 attached onto the dies 210, 220, 230 may be removed. At this time, the attachment layer 901 may also be removed.

Figure 13:
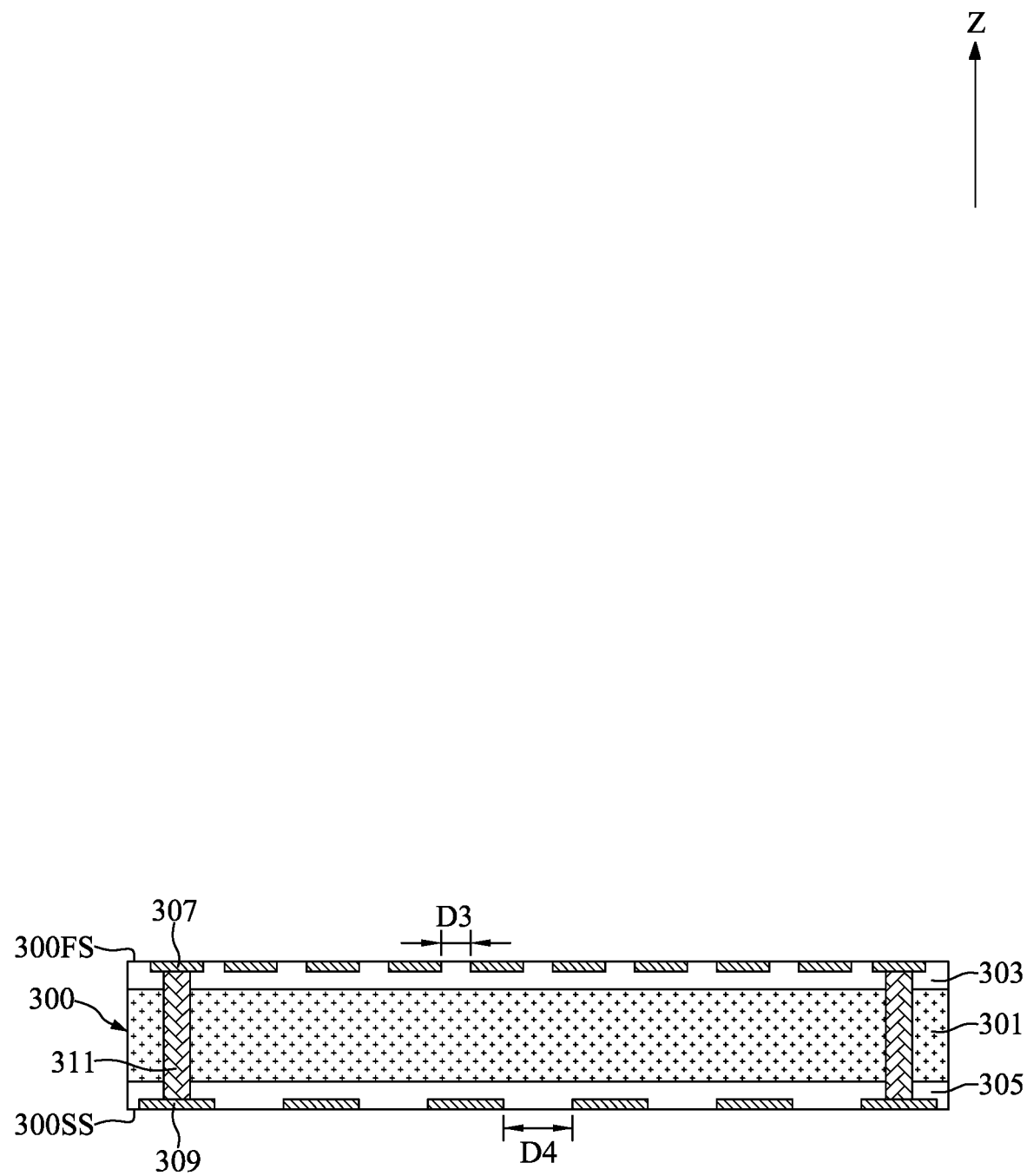

With reference to FIGS. 1 and 13, at step S17, a package structure 300 may be provided.

With reference to FIG. 13, the package structure 300 may include a package substrate 301, a top package insulating layer 303, a bottom package insulating layer 305, a plurality of top package conductive pads 307, a plurality of bottom package conductive pads 309, and a plurality of through package vias 311.

With reference to FIG. 13, the package substrate 301 may be a laminate sheet but is not limited thereto. In some embodiments, the package substrate 301 may include an epoxy based material or bismaleimide triazine. In some embodiments, the package substrate 301 may be a printed circuit board.

With reference to FIG. 13, the top package insulating layer 303 may be formed on the package substrate 301 and the bottom package insulating layer 305 may be formed under the package substrate 301. The top package insulating layer 303 and the bottom package insulating layer 305 may be formed of, for example, silicon oxide, silicon nitride, silicon oxynitride, silicon nitride oxide, polybenzoxazole, polyimide, benzocyclobutene, ajinomoto buildup film, solder resist film, the like, or a combination thereof.

Figure 14:
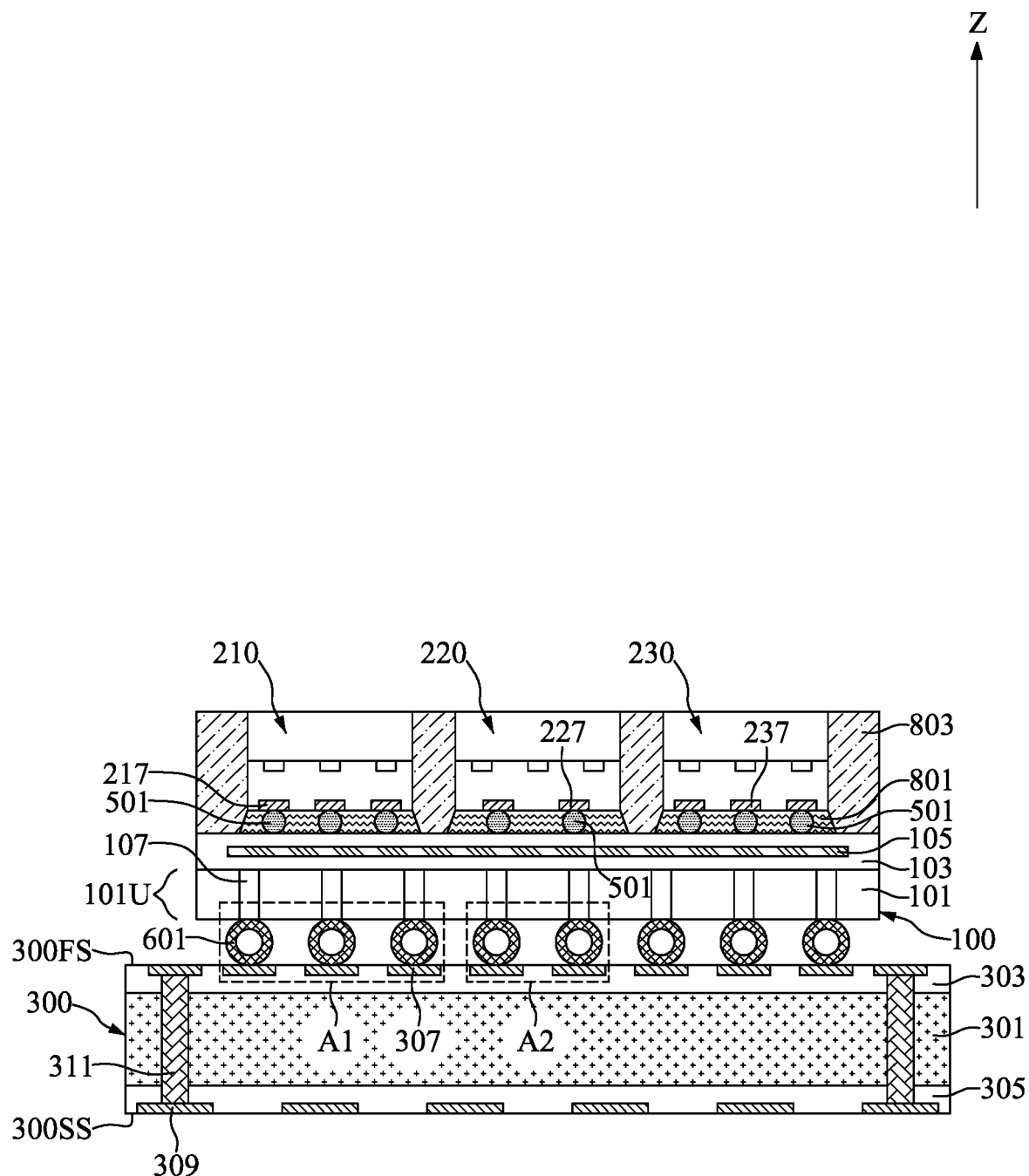

With reference to FIG. 14, the top package conductive pads 307 may be formed in the top package insulating layer 303. The top surfaces of the top package conductive pads 307 and the top surface of the top package insulating layer 303 may be substantially coplanar. The bottom package conductive pads 309 may be formed in the bottom package insulating layer 305. The top surface of the top package insulating layer 303 may be referred to as the first side 300FS. The bottom surfaces of the bottom package conductive pads 309 and the bottom surface of the bottom package insulating layer 305 may be substantially coplanar. The bottom surface of the bottom package insulating layer 305 may be referred to as the second side 300SS.

In some embodiments, the pad density, which defined by the number of pads divided by the surface area of the package insulating layer, of the top package conductive pads 307 may be greater than the pad density of the bottom package conductive pads 309. That is, the distance D3 between adjacent top package conductive pads 307 may be less than the distance D4 between adjacent bottom package conductive pads 309.

In some embodiments, the top package conductive pads 307 and the bottom package conductive pads 309 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

For brevity, clarity, and convenience of description, only one through package via 311 is described.

With reference to FIG. 13, the through package via 311 may be formed penetrating the top package insulating layer 303, the package substrate 301, and the bottom package insulating layer 305. The through package via 311 may electrically connect the top package conductive pad 307 and the bottom package conductive pad 309, respectively correspondingly. The through package via 311 may be formed of, example, copper or other applicable conductive material.

In some embodiments, an isolating layer 313 may cover the sidewall of the through package via 311 (as shown in FIG. 15). The isolating layer 313 may be formed of, for example, silicon oxide or other applicable insulating material.

With reference to FIG. 1 and FIGS. 14 to 16, at step S19, the interposer structure 100 and the package structure 300 may be bonded through a plurality of middle interconnectors 601.

With reference to FIG. 14, the middle interconnectors 601 may be formed between the first side 300FS of the package structure 300 and the interposer structure 100. The middle interconnectors 601 may be electrically connected to the through interposer vias 107 and the top package conductive pads 307, respectively and correspondingly. In some embodiments, the middle interconnectors 601 may include lead, tin, indium, bismuth, antimony, silver, gold, copper, nickel, or alloy thereof. In some embodiments, the middle interconnectors 601 may be tin solder balls. The tin solder balls may be formed by initially forming a layer of tin through evaporation, electroplating, printing, solder transfer, or ball placement to a thickness of about 10 μm to about 100 μm. Once the layer of tin has been formed on the first side 300FS of the package structure 300, a reflow process may be performed to shape the layer of tin into the desired shape and form the tin solder balls.

In the description of the present disclosure, an X-Y-Z coordinate system is assumed where X and Y refer to dimensions (directions) within the plane parallel to the major surface of the structure and Z refers a dimension (direction) perpendicular to the plane, two features are topographically aligned when those features have substantially the same X, Y coordinates.

In some embodiments, the first die 210 and the second die 220 may have a same surface area in a top-view perspective (not shown). The number of the middle interconnector 601 topographically aligned with the first die 210 (circled with dashed lines and marked as A1) may be greater the number of the middle interconnector 601 topographically aligned with the second die 220 (circled with dashed lines and marked as A2). In other words, the middle interconnector 601 topographically aligned with (or directly disposed under) the first die 210 may have a first density greater than a second density of the middle interconnector 601 topographically aligned with (or directly disposed under) the second die 220.

For brevity, clarity, and convenience of description, only one middle interconnector 601 is described.

With reference to FIGS. 14 to 16, in some embodiments, a first lower annular pad 603 may be formed on the top package conductive pad 307. A first upper annular pad 605 may be formed under the through interposer via 107. In some embodiments, the first lower annular pad 603 and the first upper annular pad 605 may be formed of, for example, copper or other suitable metal or metal alloy.

The middle interconnector 601 may include a middle exterior layer 601E and a first cavity 611. The middle exterior layer 601E may be formed between the first lower annular pad 603 and the first upper annular pad 605. The middle exterior layer 601E, the first lower annular pad 603, and the first upper annular pad 605 may have ring-shaped cross-sectional profiles, respectively and correspondingly. The space enclosed by the top package conductive pad 307, the first lower annular pad 603, the middle exterior layer 601E, the first upper annular pad 605, and the through interposer via 107 may be referred to as the first cavity 611.

In some embodiments, through the use of the first lower annular pad 603 on the top package conductive pad 307, a first "seeding" point is created for the accumulation of vaporized flux at the non-conducting/non-wetting center of the annulus. As the vapor expands during solder heating and liquefaction, a first interior cavity (not shown) is formed that is contained by the surface tension and viscosity of the molten solder. By including a second seeding point in the first upper annular pad 605 on the through interposer via 107, a second interior cavity (not shown) is started that joins with the first interior cavity to produce the resulting first cavity 611. The surface tension properties force the formation of an exterior convex shape on the liquefied structure, that when cooled, solidifies in the barrel-shaped form of middle exterior layer 601E, since the outer shell solidifies before the vaporized fluxing agent in the interior contracts.

In some embodiments, a relative volume of the first cavity 611 may range from 1% to 90% of the total volume of the middle interconnector 601. The volume of the first cavity 611 may be controlled by controlling the temperature and time during heating of the solder. The composition of the solder should balance the properties of the solder and solder-alloys with the properties of a fluxing vapor. An exemplary solder compound can consist of portions any of the general soldering materials, such as solder, silver, and tin, and a fluxing agent, such as one or more from the group of rosin, resin, activator, thixotropic agent, and a high temperature boiling solvent.

Potential destructive stress forces during fabricating or operating the semiconductor device 1A may be neutralized and reduced or removed by the middle interconnector 601 including the first cavity 611. As a result, the yield and the reliability of the semiconductor device 1A may be improved.

With reference to FIGS. 17 and 18, a first resist layer 607 may be formed on the first side 300FS of the package structure 300 and surround the first lower annular pad 603. The first resist layer 607 may also cover a portion of the exterior surface of the middle exterior layer 601E. A second resist layer 609 may be formed on the bottom surface of the interposer substrate 101 and surround the first upper annular pads 605. The second resist layer 609 may also cover a portion of the exterior surface of the middle exterior layer 601E. The first resist layer 111 and the second resist layer 609 may respectively include polybenzoxazole, polyimide, benzocyclobutene, epoxy laminate, or ammonium bifluoride.

With reference to FIGS. 17 and 18, the middle underfill layer 805 may be filled between the interposer structure 100 and the package structure 300. The middle underfill layer 805 may surround the middle interconnectors 601. In some embodiments, the middle underfill layer 805 may also seal a portion of the lateral surface (e.g., side surface) of the interposer structure 100.

In some embodiments, the middle underfill layer 805 may be formed by curing an underfill material which is made up of a cross-linked organic resin and low CTE inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The middle underfill layer 805 may tightly adhere to the interposer structure 100 and the package structure 300 so as to the middle underfill layer 805 may redistribute the stresses and strains from the CTE mismatch and mechanical shock over the interposer structure 100. As a result, crack initiation and growth in the middle interconnectors 601 may be either prevented or drastically reduced. In addition, the middle underfill layer 805 may provide protection to the middle interconnectors 601 to improve mechanical integrity of the configuration of the interposer structure 100 and the package structure 300. Furthermore, the middle underfill layer 805 may provide partial protection against moisture ingress, and other forms of contamination.

With reference to FIGS. 17 and 18, the middle molding layer 807 may be formed to completely cover the interposer structure 100. The middle molding layer 807 may be formed of a molding compound such as polybenzoxazole, polyimide, benzocyclobutene, epoxy laminate, or ammonium bifluoride. The middle molding layer 807 may be formed by compressive molding, transfer molding, liquid encapsulent molding, and the like. For example, a molding compound may be dispensed in liquid form. Subsequently, a curing process is performed to solidify the molding compound. The formation of molding compound may overflow the interposer structure 100 so that molding compound covers the interposer structure 100.

Figure 19:
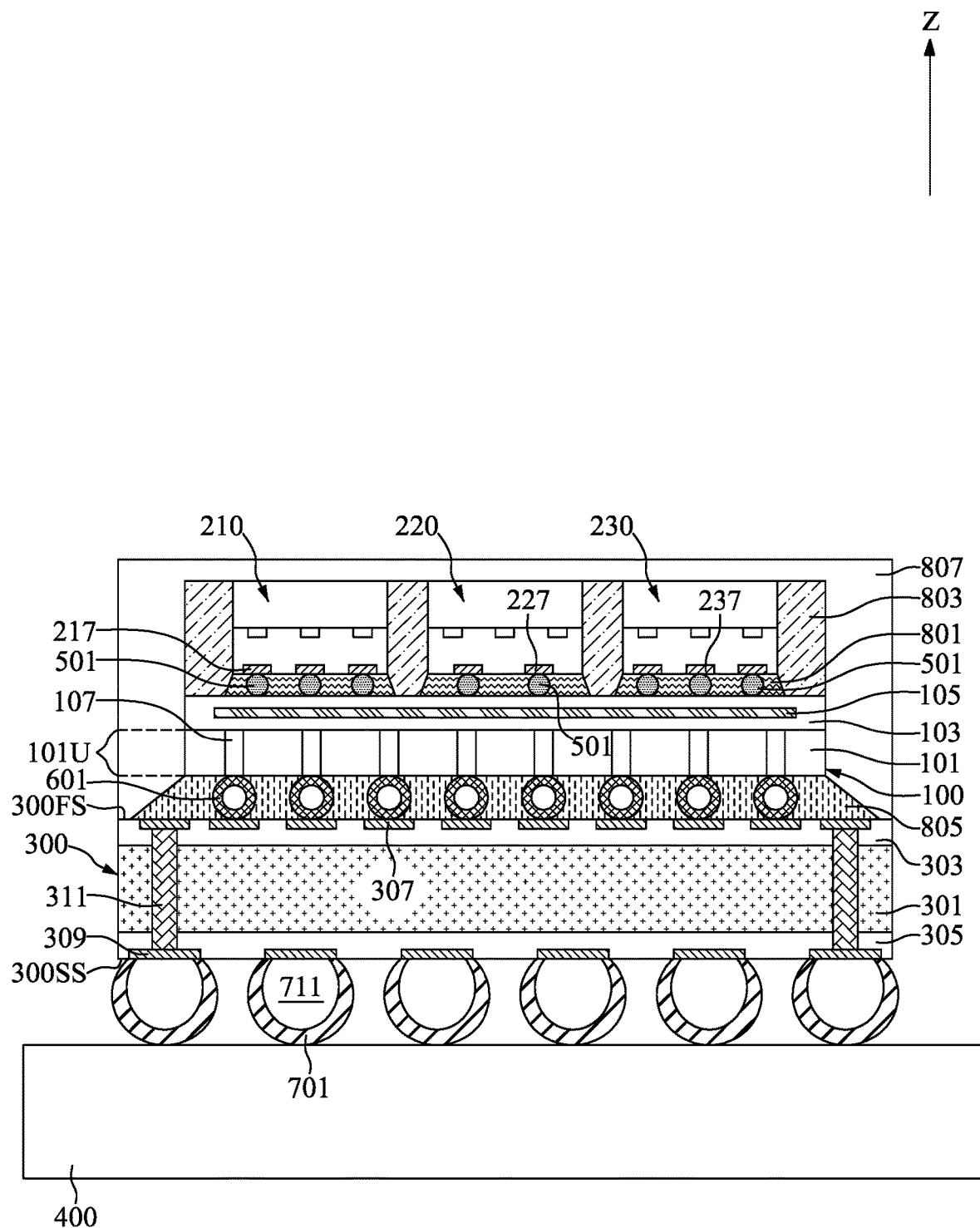
FIG. 19 illustrates, in a schematic cross-sectional view diagram, part of the flow for fabricating the semiconductor device in accordance with one embodiment of the present disclosure.
Figure 20:
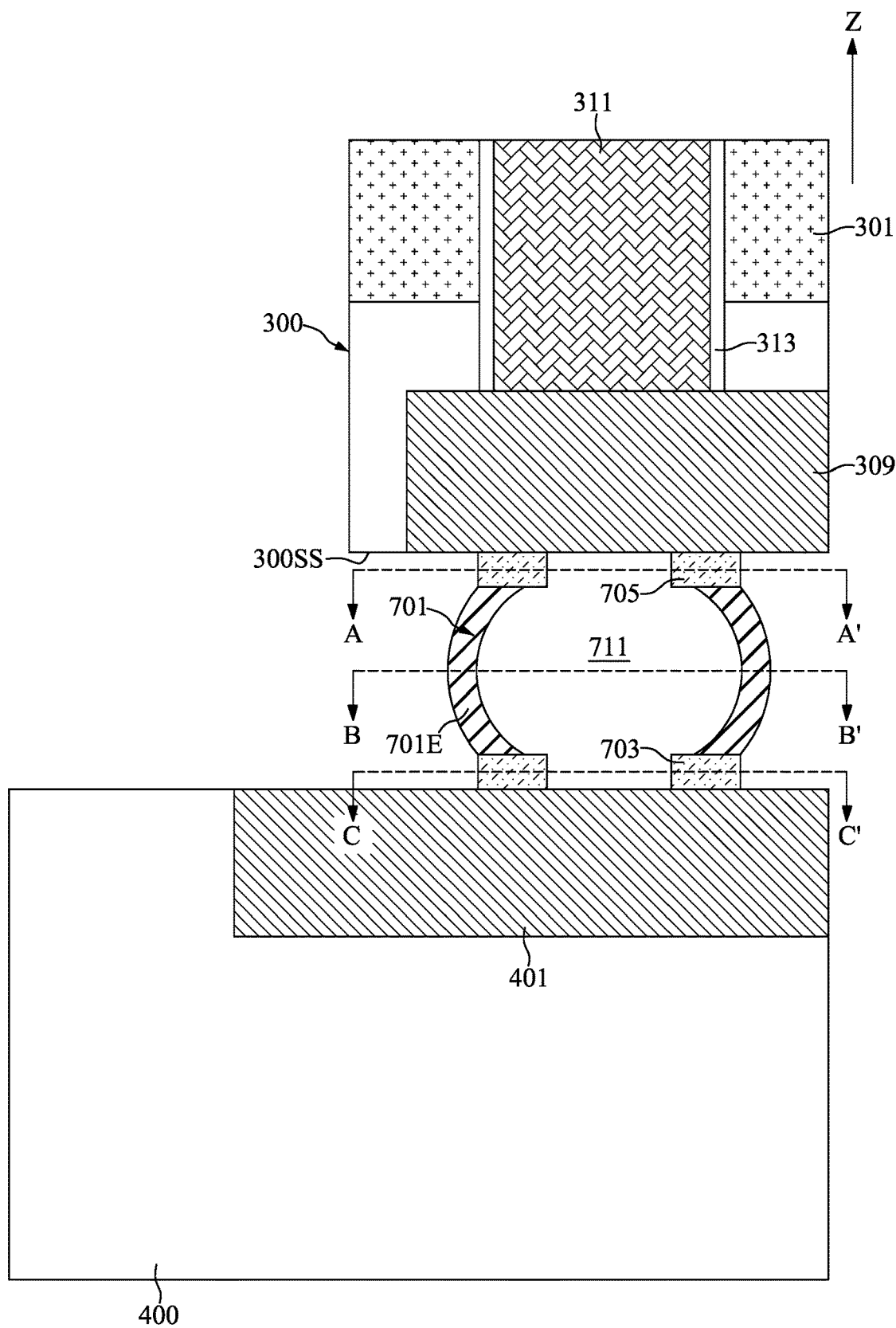
FIG. 20 is a close-up schematic cross-sectional view diagram of FIG. 19.
Figure 21:
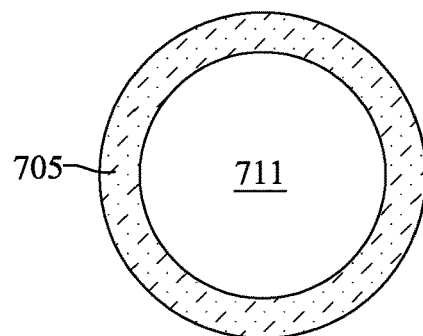
FIG. 21 is a schematic cross-sectional view diagram taken along lines A-A', B-B', and C-C' in FIG. 20.
Figure 21:
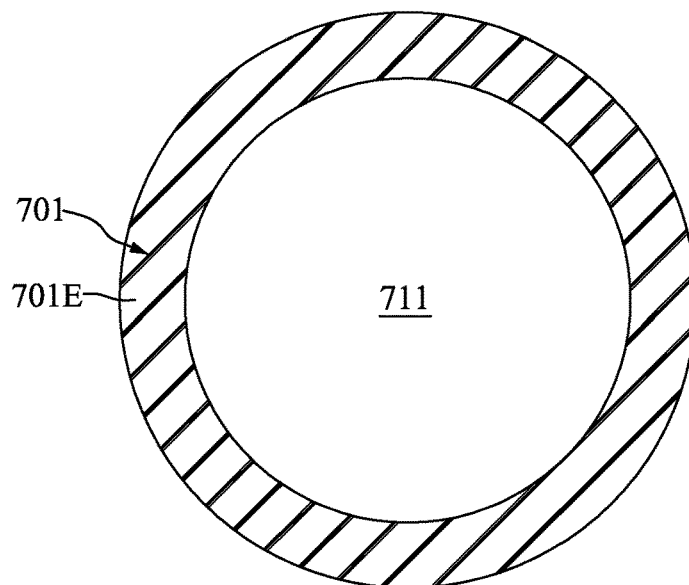
Figure 21:
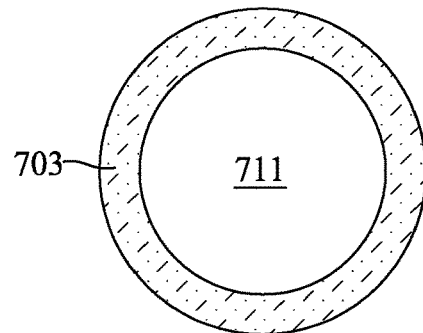
Figure 22:
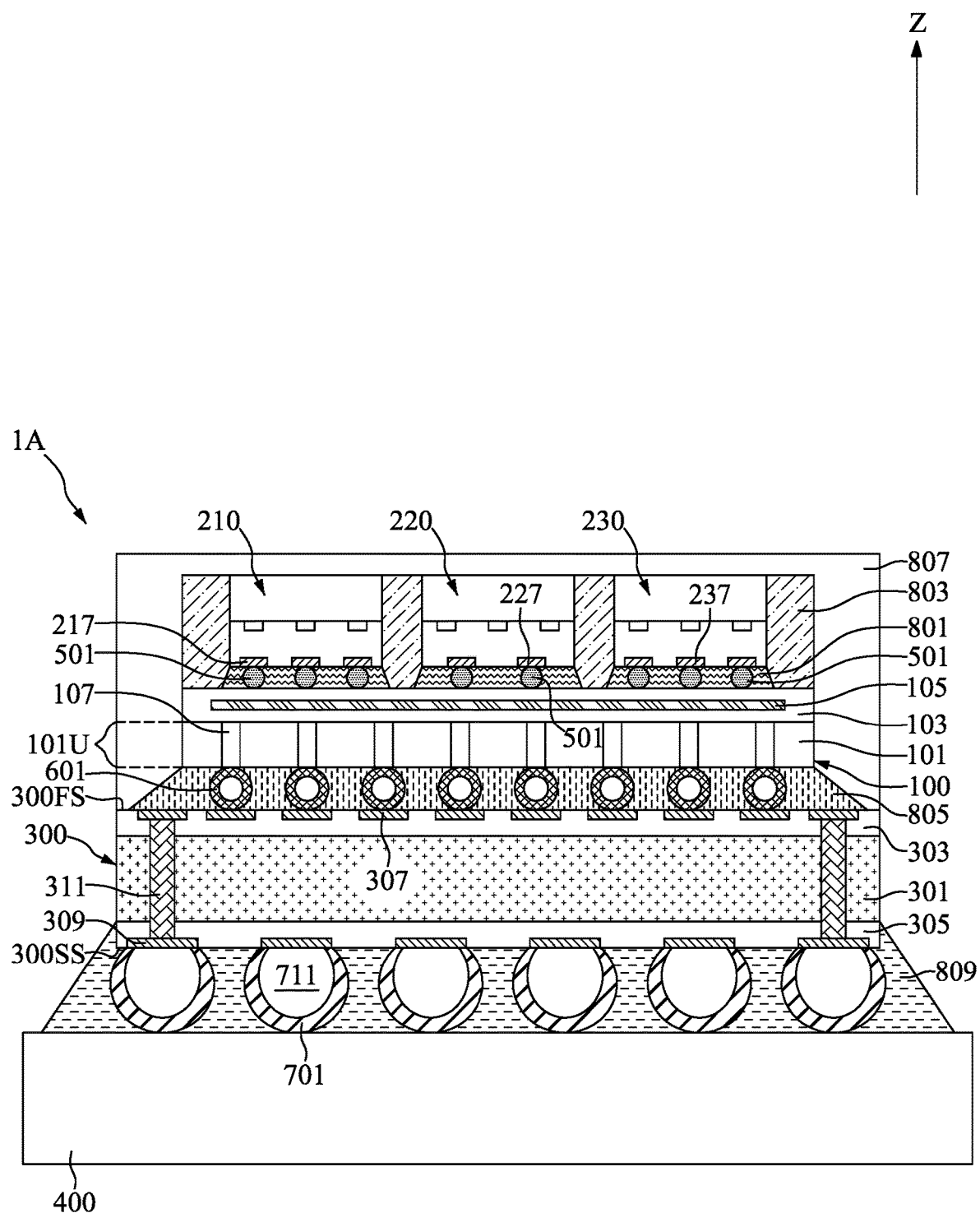
FIG. 22 illustrates, in a schematic cross-sectional view diagram, part of the flow for fabricating the semiconductor device in accordance with one embodiment of the present disclosure.
Figure 23:
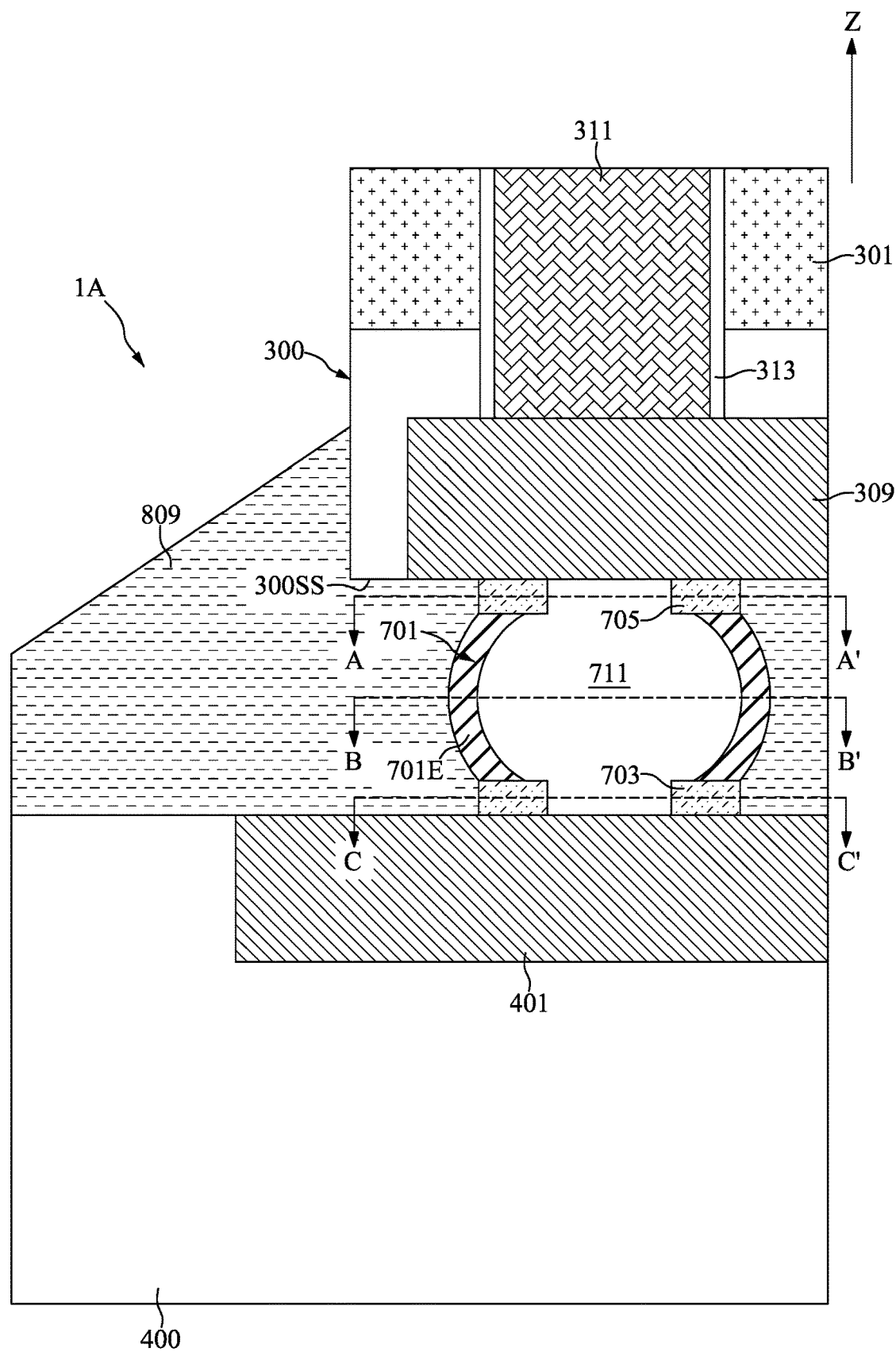
FIG. 23 is a close-up schematic cross-sectional view diagram of FIG. 22.

FIG. 19 illustrates, in a schematic cross-sectional view diagram, part of the flow for fabricating the semiconductor device 1A in accordance with one embodiment of the present disclosure. FIG. 20 is a close-up schematic cross-sectional view diagram of FIG. 19. FIG. 21 is a schematic cross-sectional view diagram taken along lines A-A', B-B', and C-C' in FIG. 20. FIG. 22 illustrates, in a schematic cross-sectional view diagram, part of the flow for fabricating the semiconductor device 1A in accordance with one embodiment of the present disclosure. FIG. 23 is a close-up schematic cross-sectional view diagram of FIG. 22.

With reference to FIG. 1 and FIGS. 19 to 23, at step S21, the package structure 300 and a base structure 400 may be bonded through a plurality of bottom interconnectors 701.

With reference to FIGS. 19 and 20, the base structure 400 may be provided. The base structure 400 may include an epoxy based material or bismaleimide triazine. In some embodiments, the base structure 400 may be a laminate sheet but is not limited thereto. In some embodiments, the base structure 400 may be a printed circuit board. It should be noted that the wiring pattern of the base structure 400 is not shown for clarity. The wiring pattern of the base structure may electrically couple to the bottom package conductive pads 309 through the bottom interconnectors 701.

With reference to FIGS. 19 to 21, the bottom interconnectors 701 may be formed between the second side 300SS of the package structure 300 and the base structure 400. The bottom interconnectors 701 may be electrically connected to the bottom package conductive pads 309 and the base conductive pads 401 of the base structure 400, respectively and correspondingly. In some embodiments, the middle interconnectors 601 may include lead, tin, indium, bismuth, antimony, silver, gold, copper, nickel, or alloy thereof. In some embodiments, the bottom interconnectors 701 may be tin solder balls. The tin solder balls may be formed by initially forming a layer of tin through evaporation, electroplating, printing, solder transfer, or ball placement to a thickness of about 10 µm to about 100 µm. Once the layer of tin has been formed on the second side 300SS of the package structure 300, a reflow process may be performed to shape the layer of tin into the desired shape and form the tin solder balls.

For brevity, clarity, and convenience of description, only one bottom interconnectors 701 is described.

With reference to FIGS. 19 to 21, in some embodiments, a second lower annular pad 703 may be formed on the base conductive pad 401. A second upper annular pad 705 may be formed under the bottom package conductive pad 309. In some embodiments, the second lower annular pad 703 and the second upper annular pad 705 may be formed of, for example, copper or other suitable metal or metal alloy.

The bottom interconnector 701 may include a bottom exterior layer 701E and a second cavity 711. The bottom exterior layer 701E may be formed between the second lower annular pad 703 and the second upper annular pad 705. The bottom exterior layer 701E, the second lower annular pad 703, and the second upper annular pad 705 may have ring-shaped cross-sectional profiles, respectively and correspondingly. The space enclosed by the bottom package conductive pad 309, the second lower annular pad 703, the bottom exterior layer 701E, the second upper annular pad 705, and the base conducive pad 401 may be referred to as the second cavity 711.

In some embodiments, through the use of the second lower annular pad 703 on the base conducive pads 401, a first "seeding" point is created for the accumulation of vaporized flux at the non-conducting/non-wetting center of the annulus. As the vapor expands during solder heating and liquefaction, a first interior cavity (not shown) is formed that is contained by the surface tension and viscosity of the molten solder. By including a second seeding point in the second upper annular pad 705 on the bottom package conductive pad 309, a second interior cavity (not shown) is started that joins with the first interior cavity to produce the resulting second cavity 711. The surface tension properties force the formation of an exterior convex shape on the liquefied structure, that when cooled, solidifies in the barrel-shaped form of bottom exterior layer 701E, since the outer shell solidifies before the vaporized fluxing agent in the interior contracts.

In some embodiments, a relative volume of the second cavity 711 may range from 1% to 90% of the total volume of the bottom interconnector 701. The volume of the second cavity 711 may be controlled by controlling the temperature and time during heating of the solder. The composition of the solder should balance the properties of the solder and solder-alloys with the properties of a fluxing vapor. An exemplary solder compound can consist of portions any of the general soldering materials, such as solder, silver, and tin, and a fluxing agent, such as one or more from the group of rosin, resin, activator, thixotropic agent, and a high temperature boiling solvent.

Potential destructive stress forces during fabricating or operating the semiconductor device 1A may be neutralized and reduced or removed by the bottom interconnector 701 including the second cavity 711. As a result, the yield and the reliability of the semiconductor device 1A may be improved.

With reference to FIGS. 22 and 23, the bottom underfill layer 809 may be filled between the package structure 300 and the base structure 400. The bottom underfill layer 809 may surround the bottom interconnectors 701. In some embodiments, the bottom interconnectors 701 may also seal a portion of the lateral surface (e.g., side surface) of the package structure 300.

In some embodiments, the bottom underfill layer 809 may be formed by curing an underfill material which is made up of a cross-linked organic resin and low CTE inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The bottom underfill layer 809 may tightly adhere to the package structure 300 and the base structure 400 so as to the bottom underfill layer 809 may redistribute the stresses and strains from the CTE mismatch and mechanical shock over the package structure 300. As a result, crack initiation and growth in the bottom interconnectors 701 may be either prevented or drastically reduced. In addition, the bottom underfill layer 809 may provide protection to the bottom interconnectors 701 to improve mechanical integrity of the configuration of the package structure 300 and the base structure 400. Furthermore, the bottom underfill layer 809 may provide partial protection against moisture ingress, and other forms of contamination.

Figure 24:
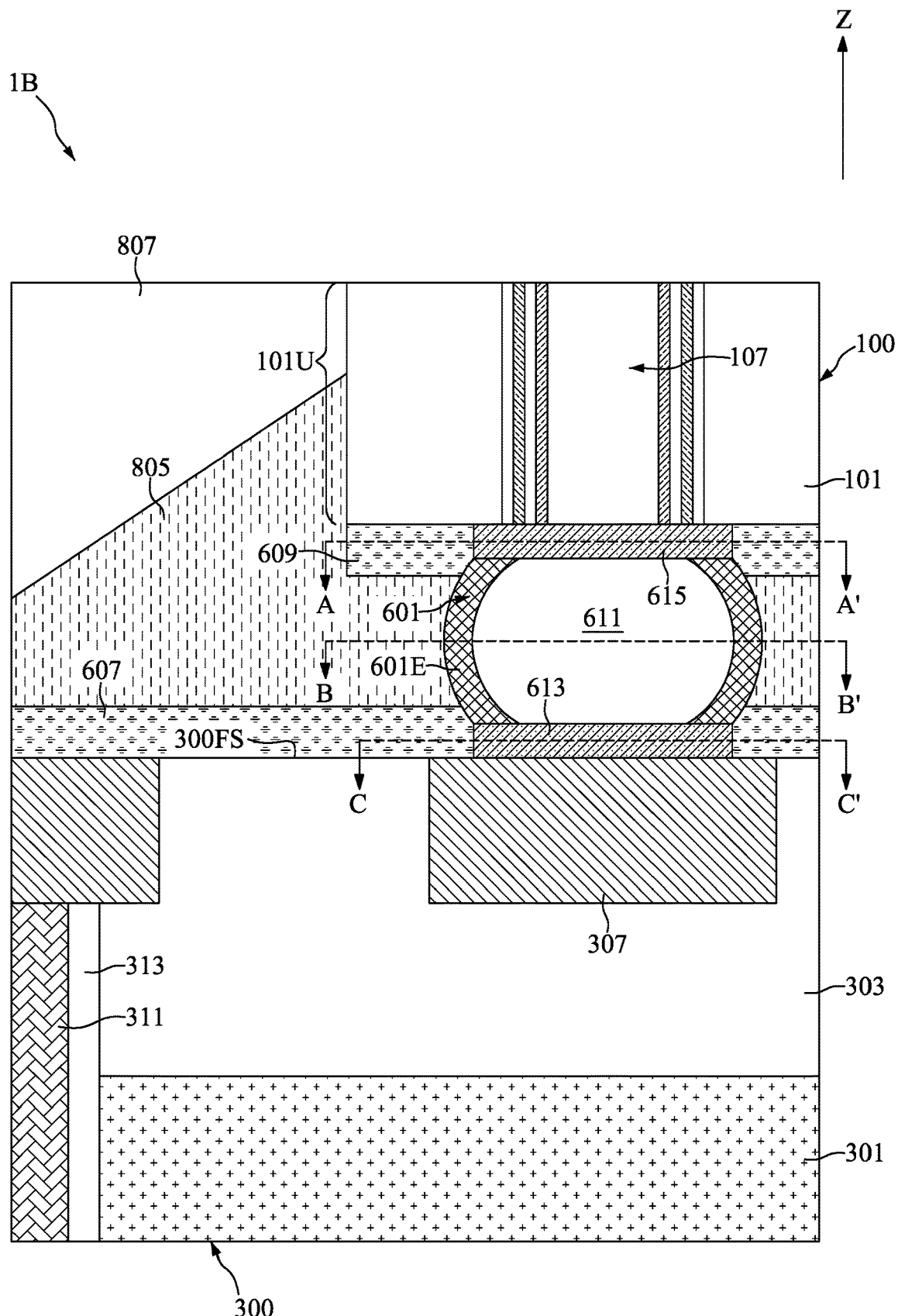
FIG. 24 is a close-up schematic cross-sectional view diagram of a semiconductor device in accordance with another embodiment of the present disclosure.
Figure 25:
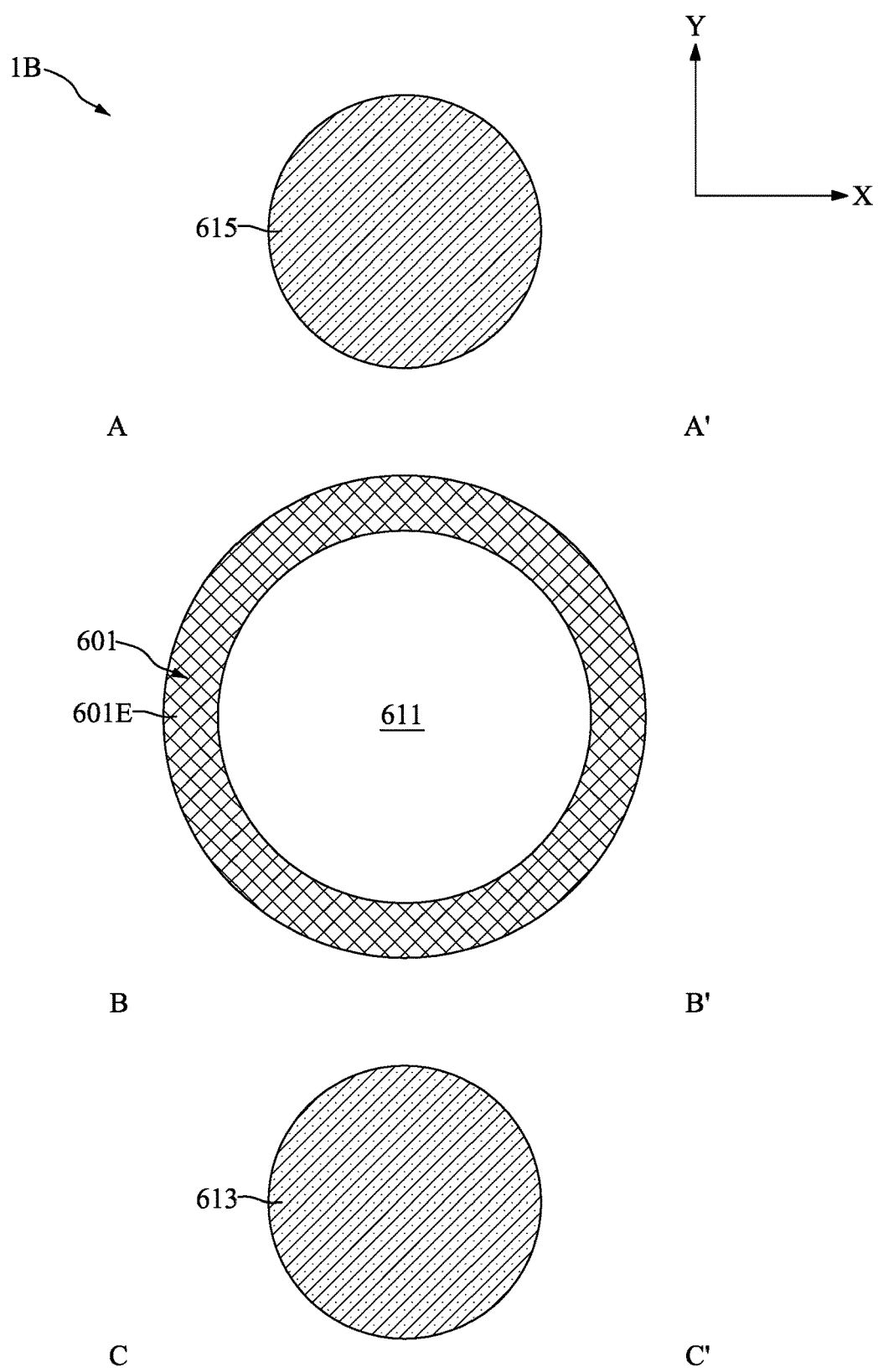
FIG. 25 is a schematic cross-sectional view diagram taken along lines A-A', B-B', and C-C' in FIG. 24.

FIG. 24 is a close-up schematic cross-sectional view diagram of a semiconductor device 1B in accordance with another embodiment of the present disclosure. FIG. 25 is a schematic cross-sectional view diagram taken along lines A-A', B-B', and C-C' in FIG. 24.

With reference to FIG. 24, the semiconductor device 1B may have a structure similar to that illustrated in FIG. 18. The same or similar elements in FIG. 24 as in FIG. 18 have been marked with similar reference numbers and duplicative descriptions have been omitted.

With reference to FIGS. 24 and 25, a first lower circular pad 613 may be formed on the top package conductive pad 307. A first upper circular pad 615 may be formed under the through interposer via 107. In some embodiments, the first lower circular pad 613 and the first upper circular pad 615 may be formed of, for example, copper or other suitable metal or metal alloy. The middle exterior layer 601E may be formed between the first lower circular pad 613 and the first lower circular pad 613. The middle exterior layer 601E may have a ring-shaped cross-sectional profile. The first lower circular pad 613 and the first upper circular pad 615 may have circle cross-sectional profiles, respectively and correspondingly. The space enclosed by the top package conductive pad 307, the first lower circular pad 613, the middle exterior layer 601E, the first upper circular pad 615, and the through interposer via 107 may be referred to as the first cavity 611.

Figure 26:
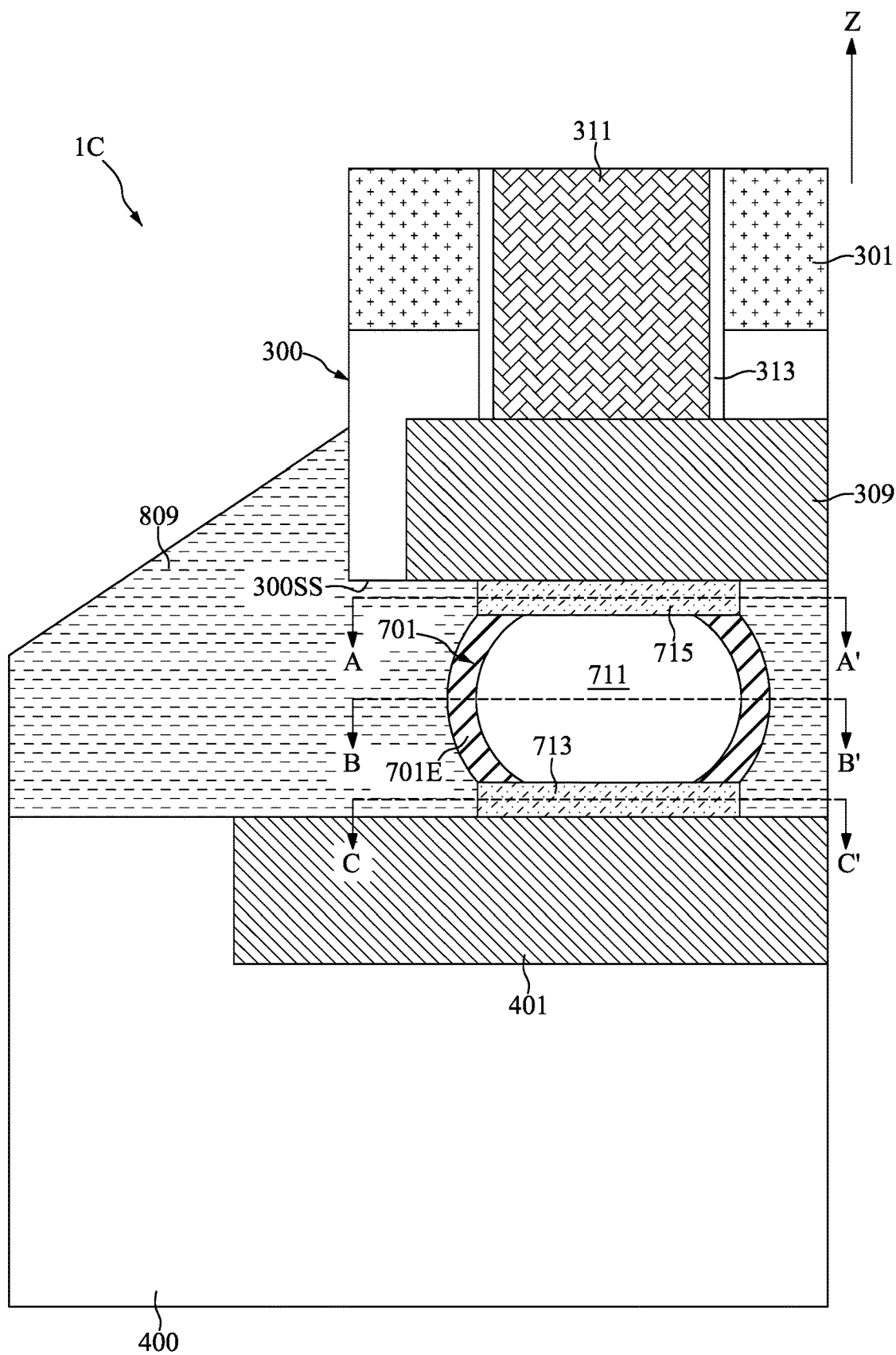
FIG. 26 is a close-up schematic cross-sectional view diagram of a semiconductor device in accordance with another embodiment of the present disclosure.
Figure 27:
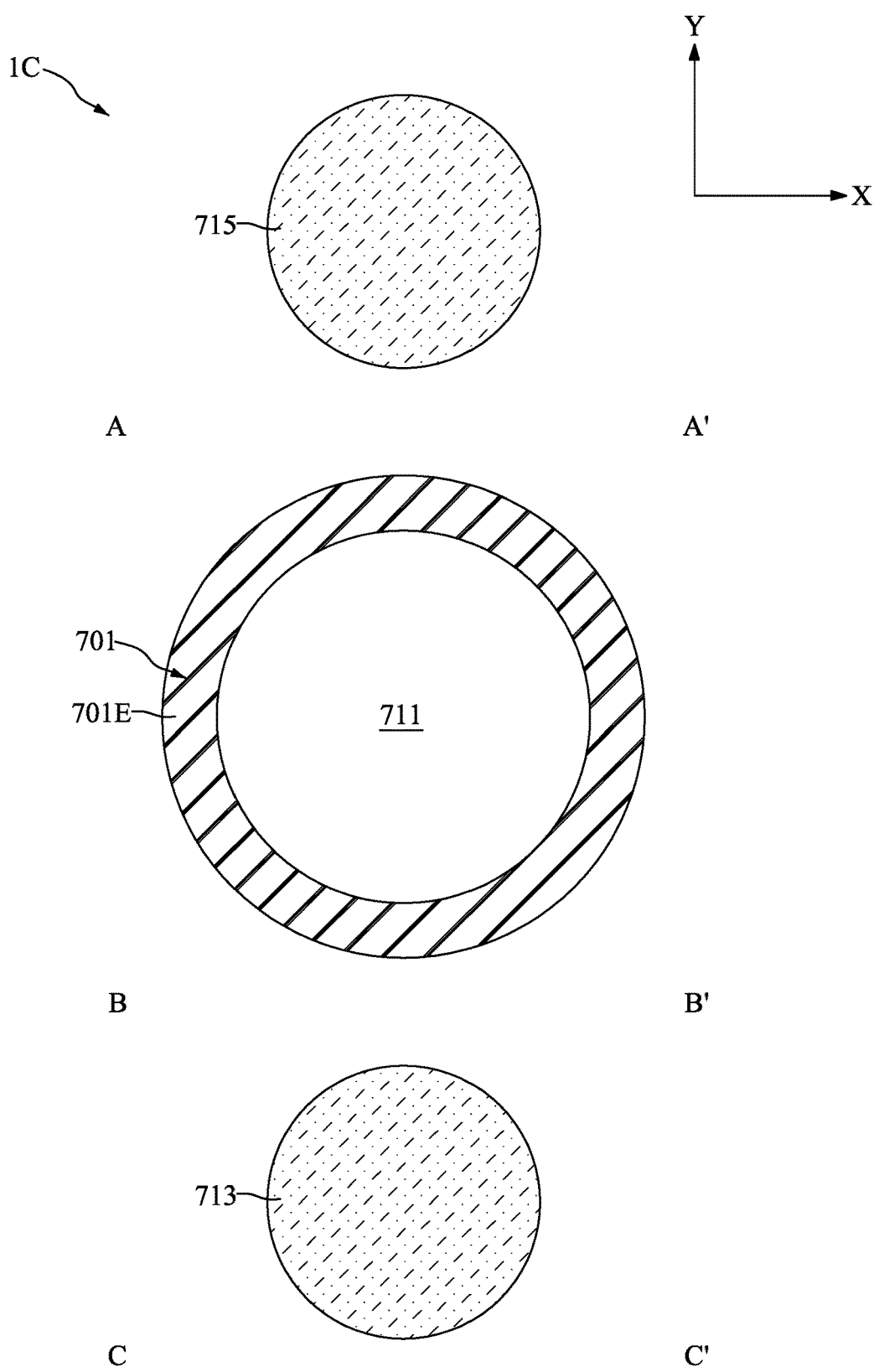
FIG. 27 is a schematic cross-sectional view diagram taken along lines A-A', B-B', and C-C' in FIG. 26.

FIG. 26 is a close-up schematic cross-sectional view diagram of a semiconductor device 1C in accordance with another embodiment of the present disclosure. FIG. 27 is a schematic cross-sectional view diagram taken along lines A-A', B-B', and C-C' in FIG. 26.

With reference to FIG. 26, the semiconductor device 1C may have a structure similar to that illustrated in FIG. 23. The same or similar elements in FIG. 26 as in FIG. 23 have been marked with similar reference numbers and duplicative descriptions have been omitted.

With reference to FIGS. 26 and 27, a second lower circular pad 713 may be formed on the base conductive pad 401. A second upper circular pad 715 may be formed under the bottom package conductive pad 309. In some embodiments, the second lower circular pad 713 and the second upper circular pad 715 may be formed of, for example, copper or other suitable metal or metal alloy. The bottom exterior layer 701E may be formed between the second lower circular pad 713 and the second upper circular pad 715. The bottom exterior layer 701E may have a ring-shaped cross-sectional profile. The second lower circular pad 713 and the second upper circular pad 715 may have circle cross-sectional profiles, respectively and correspondingly. The space enclosed by the bottom package conductive pad 309, the second lower circular pad 713, the bottom exterior layer 701E, the second upper circular pad 715, and the base conducive pad 401 may be referred to as the second cavity 711.

Figure 28:
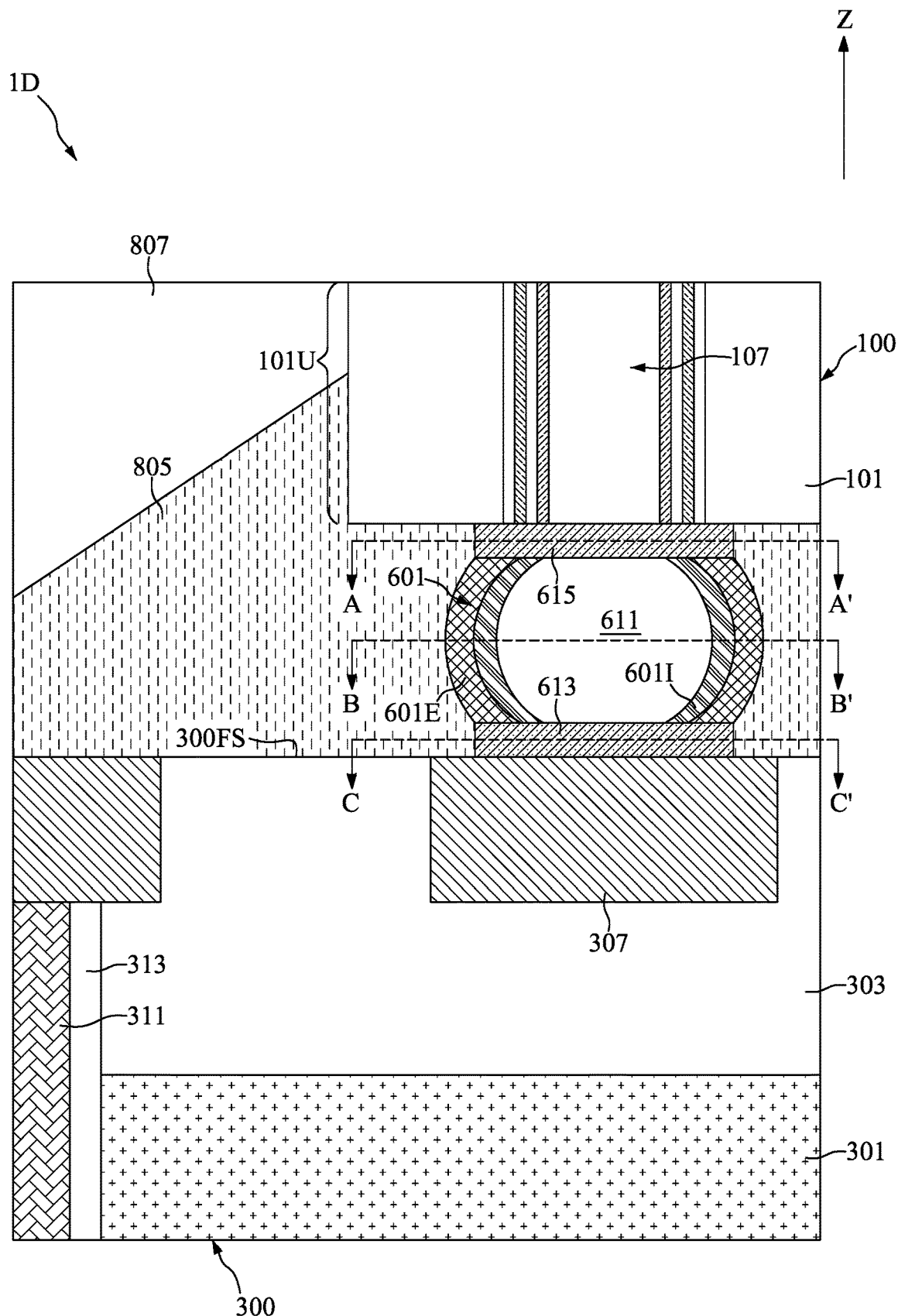
FIG. 28 is a close-up schematic cross-sectional view diagram of a semiconductor device in accordance with another embodiment of the present disclosure.
Figure 29:
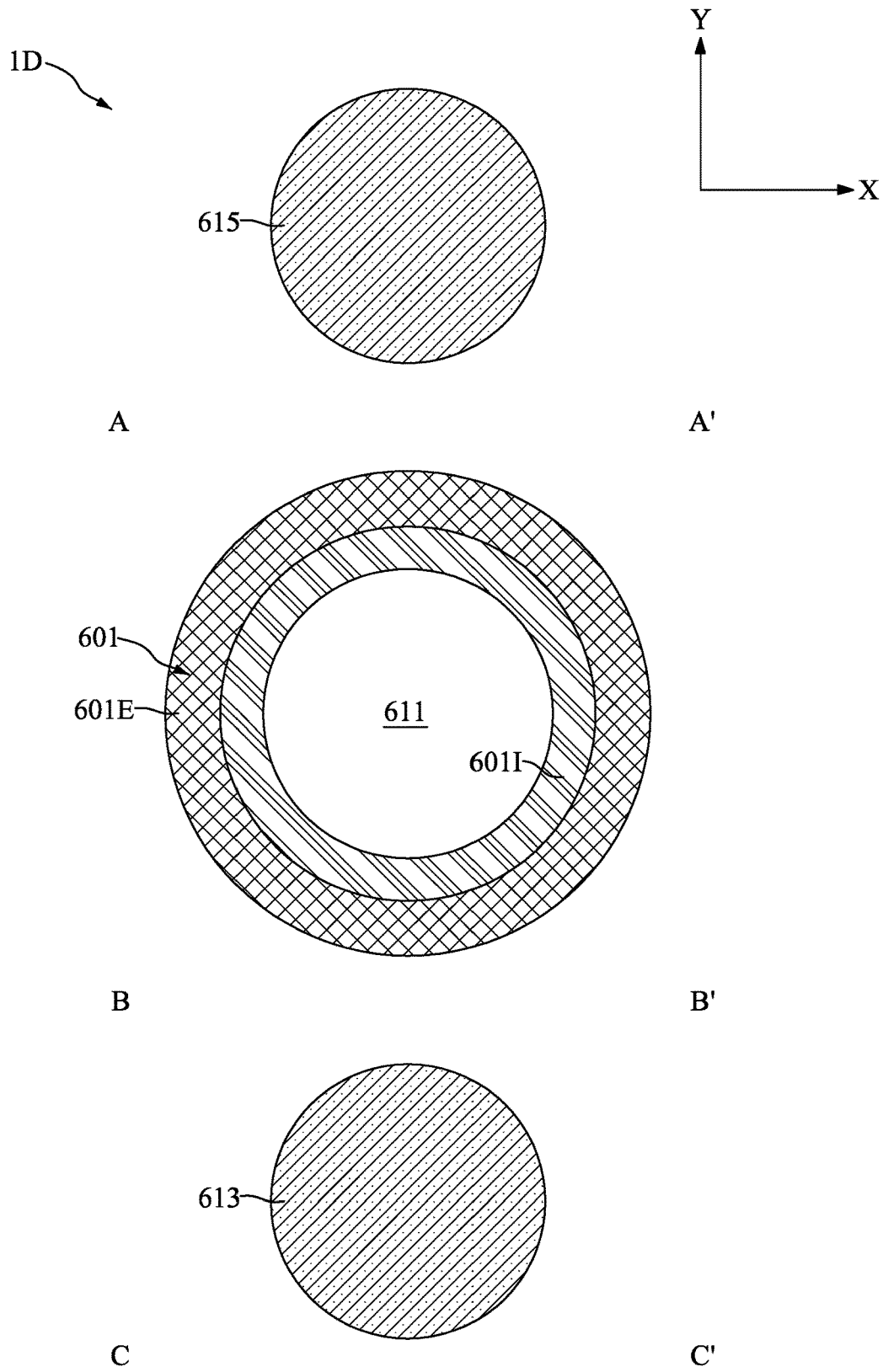
FIG. 29 is a schematic cross-sectional view diagram taken along lines A-A', B-B', and C-C' in FIG. 28.

FIG. 28 is a close-up schematic cross-sectional view diagram of a semiconductor device 1D in accordance with another embodiment of the present disclosure. FIG. 29 is a schematic cross-sectional view diagram taken along lines A-A', B-B', and C-C' in FIG. 28.

With reference to FIG. 28, the semiconductor device 1D may have a structure similar to that illustrated in FIG. 24. The same or similar elements in FIG. 28 as in FIG. 24 have been marked with similar reference numbers and duplicative descriptions have been omitted.

With reference to FIGS. 28 and 29, a middle interior layer 601I may be formed between the first lower circular pad 613 and the first upper circular pad 615 and formed on the interior surface of the middle exterior layer 601E. The middle exterior layer 601E and the middle interior layer 601I may have ring-shaped cross-sectional profiles, respectively and correspondingly. The first lower circular pad 613 and the first upper circular pad 615 may have circle cross-sectional profiles, respectively and correspondingly. The space enclosed by the top package conductive pad 307, the first lower circular pad 613, the middle interior layer 601I, the first upper circular pad 615, and the through interposer via 107 may be referred to as the first cavity 611. In some embodiments, the features described in FIGS. 28 and 29 can be applied to the embodiments described in FIG. 4.

Figure 30:
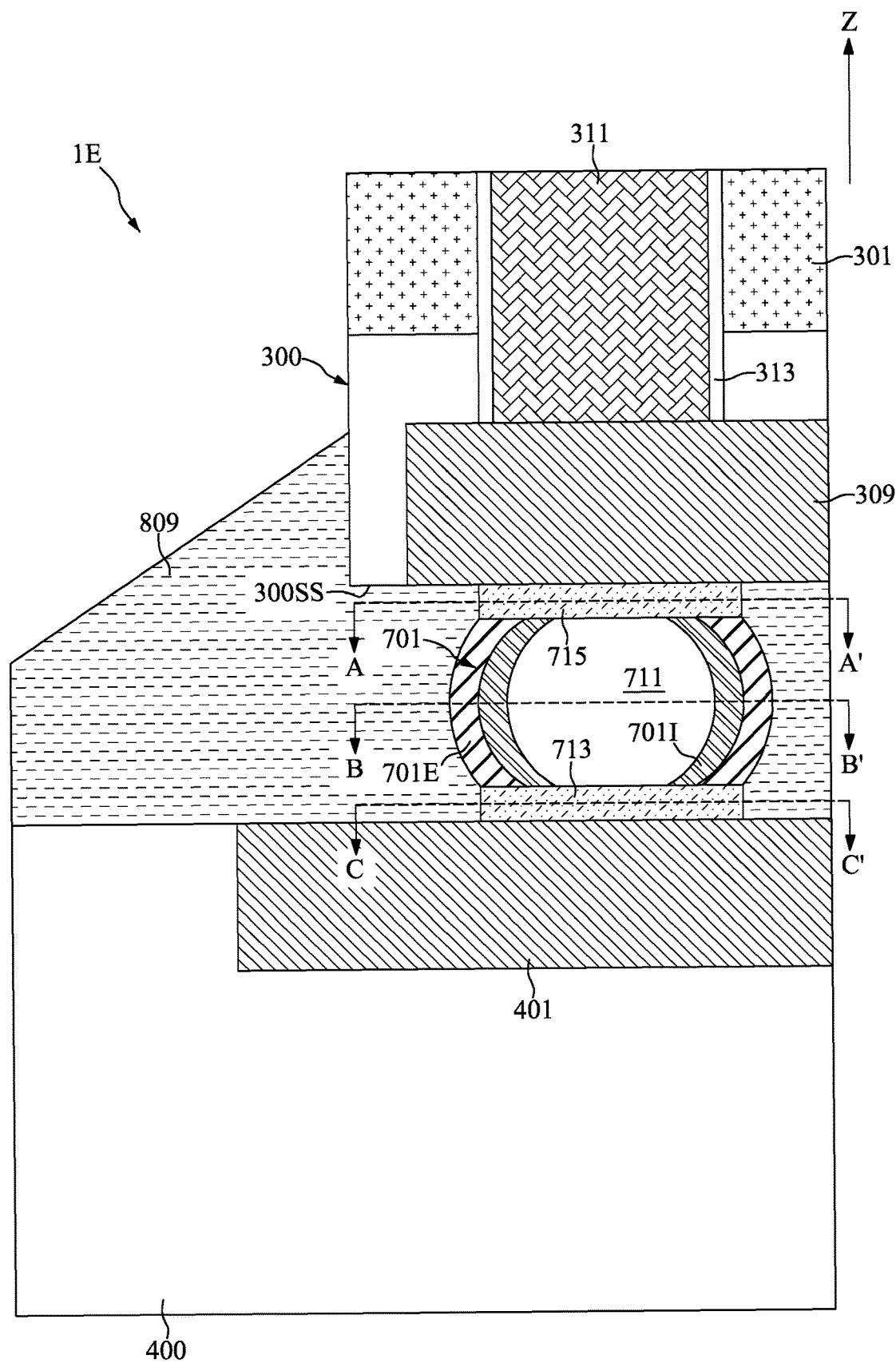
FIG. 30 is a close-up schematic cross-sectional view diagram of a semiconductor device in accordance with another embodiment of the present disclosure.
Figure 31:
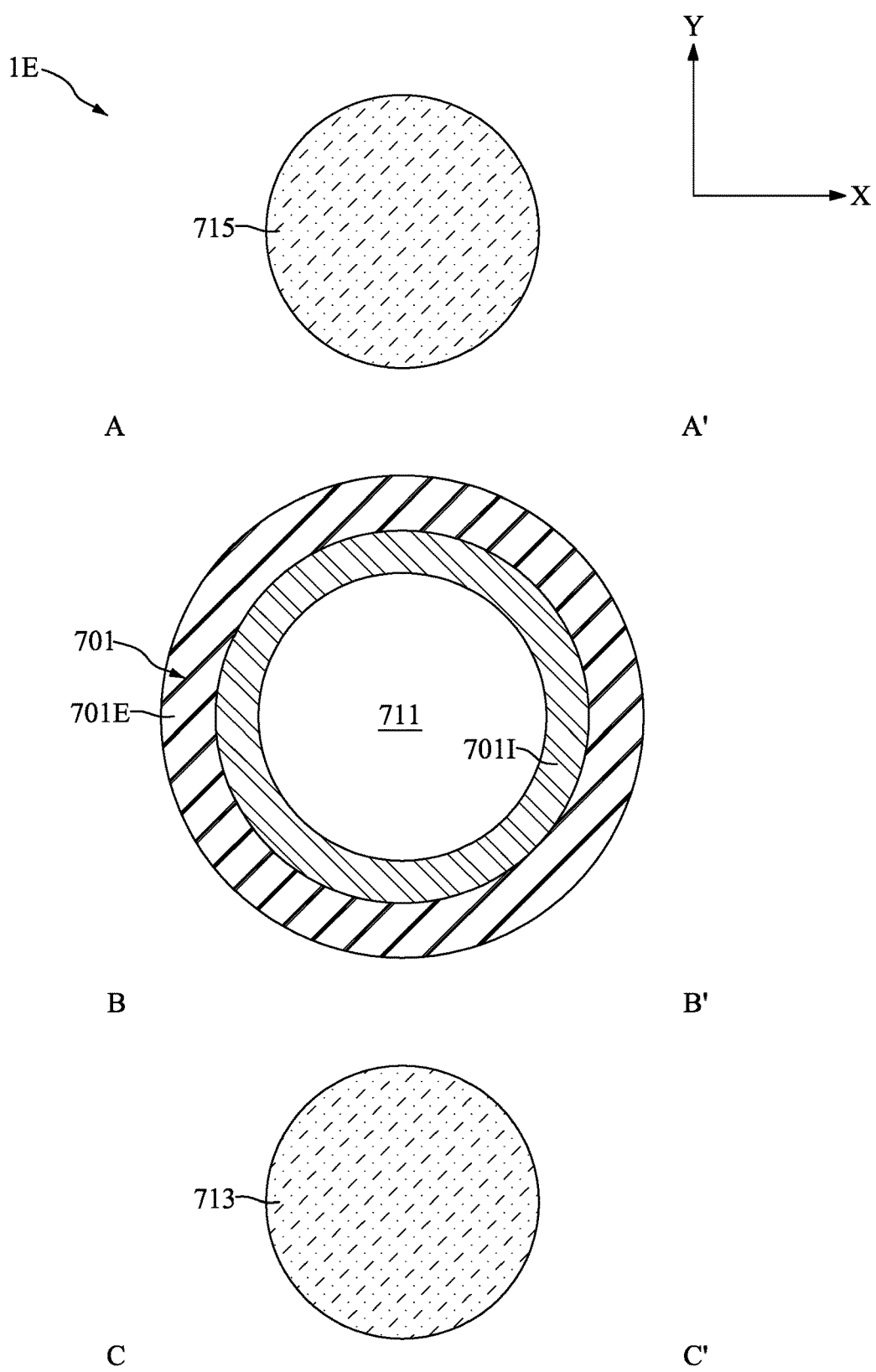
FIG. 31 is a schematic cross-sectional view diagram taken along lines A-A', B-B', and C-C' in FIG. 30.

FIG. 30 is a close-up schematic cross-sectional view diagram of a semiconductor device 1E in accordance with another embodiment of the present disclosure. FIG. 31 is a schematic cross-sectional view diagram taken along lines A-A', B-B', and C-C' in FIG. 30.

With reference to FIG. 30, the semiconductor device 1E may have a structure similar to that illustrated in FIG. 26. The same or similar elements in FIG. 30 as in FIG. 26 have been marked with similar reference numbers and duplicative descriptions have been omitted.

With reference to FIGS. 30 and 31, the bottom interior layer 701I may be formed between the second lower circular pad 713 and the second upper circular pad 715. The bottom exterior layer 701E and the bottom interior layer 701I may have ring-shaped cross-sectional profiles, respectively and correspondingly. The second lower circular pad 713 and the second upper circular pad 715 may have circle cross-sectional profiles, respectively and correspondingly. The space enclosed by the bottom package conductive pad 309, the second lower circular pad 713, the bottom interior layer 701I, the second upper circular pad 715, and the base conducive pad 401 may be referred to as the second cavity 711.

Figure 32:
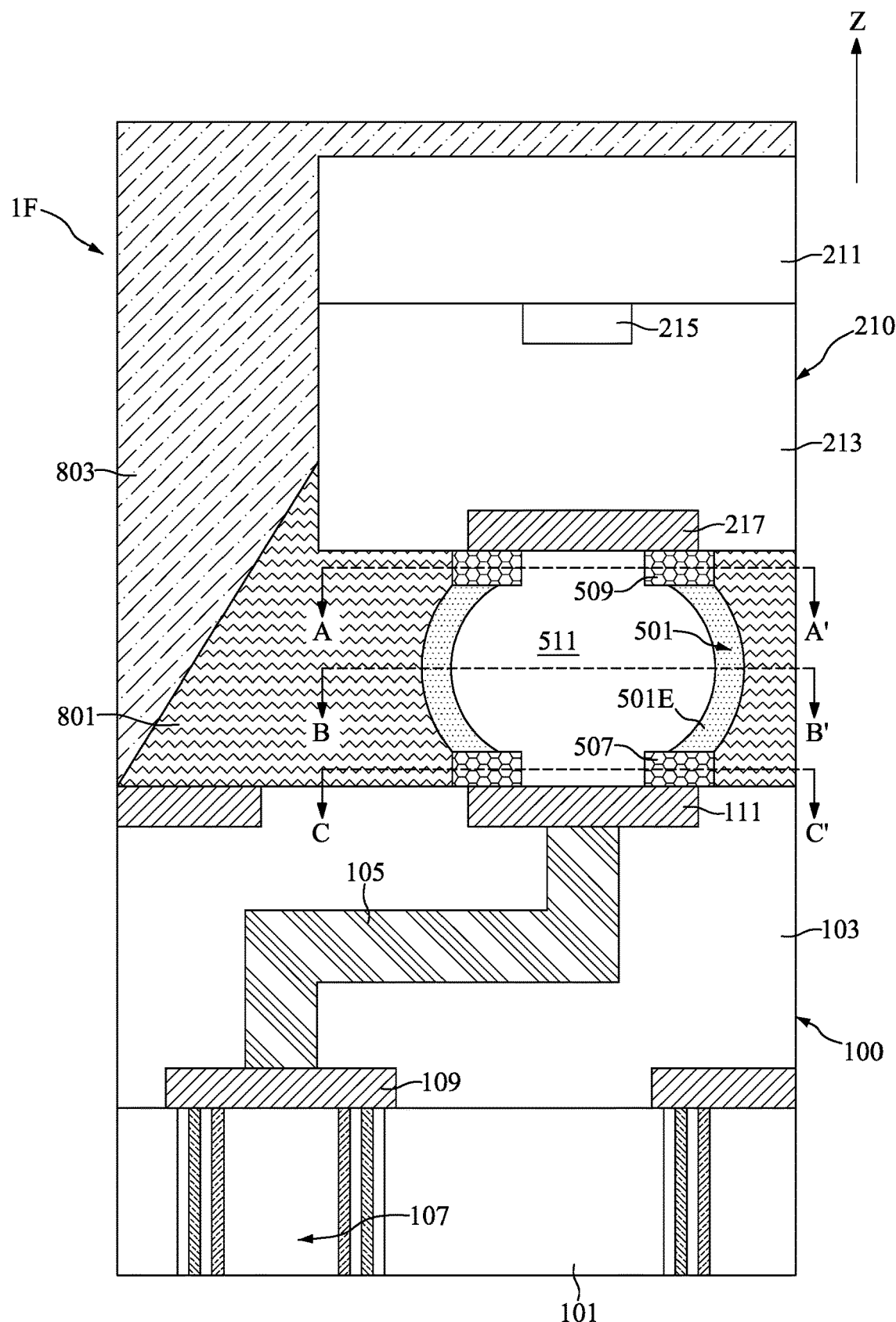
FIG. 32 is a close-up schematic cross-sectional view diagram of a semiconductor device 1F in accordance with another embodiment of the present disclosure.
Figure 33:
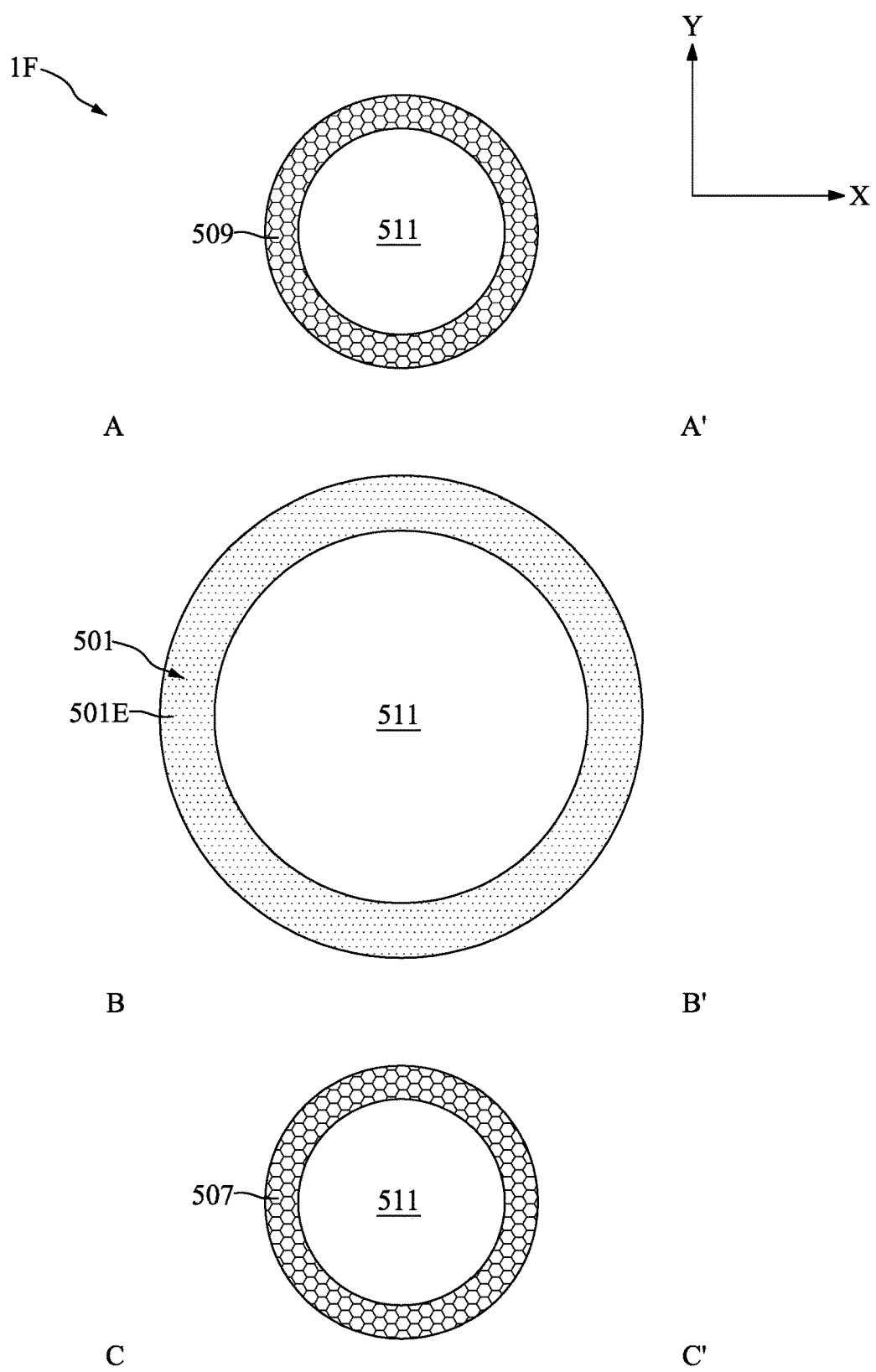
FIG. 33 is a schematic cross-sectional view diagram taken along lines A-A', B-B', and C-C' in FIG. 32.

FIG. 32 is a close-up schematic cross-sectional view diagram of a semiconductor device 1F in accordance with another embodiment of the present disclosure. FIG. 33 is a schematic cross-sectional view diagram taken along lines A-A', B-B', and C-C' in FIG. 32.

With reference to FIG. 32, the semiconductor device 1E may have a structure similar to that illustrated in FIG. 18. The same or similar elements in FIG. 32 as in FIG. 18 have been marked with similar reference numbers and duplicative descriptions have been omitted.

With reference to FIGS. 32 and 33, a third lower annular pad 507 may be formed on the interposer top pad 111. A third upper annular pad 509 may be formed under the first conductive pad 217. In some embodiments, the third lower annular pad 507 and the third upper annular pad 509 may be formed of, for example, copper or other suitable metal or metal alloy.

The top interconnector 501 may include a top exterior layer 501E and a third cavity 511. The top exterior layer 501E may be formed between the third lower annular pad 507 and the third upper annular pad 509. The top exterior layer 501E, the third lower annular pad 507, and the third upper annular pad 509 may have ring-shaped cross-sectional profiles, respectively and correspondingly. The space enclosed by the interposer top pad 111, the third lower annular pad 507, the top exterior layer 501E, the third upper annular pad 509, and the first conductive pad 217 may be referred to as the third cavity 511.

In some embodiments, through the use of the third lower annular pad 507 on the interposer top pad 111, a first "seeding" point is created for the accumulation of vaporized flux at the non-conducting/non-wetting center of the annulus. As the vapor expands during solder heating and liquefaction, a first interior cavity (not shown) is formed that is contained by the surface tension and viscosity of the molten solder. By including a second seeding point in the third upper annular pad 509 on the third upper annular pad 509, a second interior cavity (not shown) is started that joins with the first interior cavity to produce the resulting third cavity 511. The surface tension properties force the formation of an exterior convex shape on the liquefied structure, that when cooled, solidifies in the barrel-shaped form of top exterior layer 501E, since the outer shell solidifies before the vaporized fluxing agent in the interior contracts.

In some embodiments, a relative volume of the third cavity 511 may range from 1% to 90% of the total volume of the top interconnector 501. The volume of the third cavity 511 may be controlled by controlling the temperature and time during heating of the solder. The composition of the solder should balance the properties of the solder and solder-alloys with the properties of a fluxing vapor. An exemplary solder compound can consist of portions any of the general soldering materials, such as solder, silver, and tin, and a fluxing agent, such as one or more from the group of rosin, resin, activator, thixotropic agent, and a high temperature boiling solvent.

Potential destructive stress forces during fabricating or operating the semiconductor device 1F may be neutralized and reduced or removed by the top interconnector 501 including the third cavity 511. As a result, the yield and the reliability of the semiconductor device 1F may be improved.

One aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of middle interconnectors positioned between the first side of the package structure and the first die and between the first side of the package structure and the second die. The plurality of middle interconnectors topographically aligned with the first die include a first density. The plurality of middle interconnectors topographically aligned with the second die include a second density different from the first density.

Another aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of bottom interconnectors positioned on the second side of the package structure, and respectively including: a bottom exterior layer positioned on the second side of the package structure; and a cavity enclosed by the bottom exterior layer.

Another aspect of the present disclosure provides a semiconductor device including a package structure including a first side and a second side opposite to the first side; an interposer structure positioned over the first side of the package structure; a first die positioned over the interposer structure; a second die positioned over the interposer structure; and a plurality of bottom interconnectors positioned on the second side of the package structure, and respectively including: a bottom exterior layer positioned on the second side of the package structure; a bottom interior layer (FIG. 30, 701I) enclosed by the bottom exterior layer; and a cavity enclosed by the bottom interior layer.

Due to the design of the semiconductor device of the present disclosure, the different density of the middle interconnectors 601 may allow more flexible design rules. In addition, the cavities 611, 711 of the middle interconnectors 601 and the bottom interconnectors 701 may neutralize and reduce the potential destructive stress forces during fabricating or operating the semiconductor device 1A. As a result, the yield and the reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a package structure comprising a first side and a second side opposite to the first side;
an interposer structure positioned over the first side of the package structure;
a first die positioned over the interposer structure;
a second die positioned over the interposer structure; and
a plurality of bottom interconnectors positioned on the second side of the package structure, and respectively comprising:
a bottom exterior layer positioned on the second side of the package structure;
a bottom interior layer enclosed by the bottom exterior layer;
a cavity enclosed by the bottom interior layer;
a base structure positioned opposite to the first side of the package structure and electrically connected to the plurality of bottom interconnectors; and
a bottom underfill layer positioned between the package structure and the base structure, and surrounding the plurality of bottom interconnectors.

2. The semiconductor device of claim 1, further comprising a plurality of through package vias positioned along the package structure, wherein the plurality of middle interconnectors and the plurality of bottom interconnectors are electrically coupled through the plurality of through package vias.

3. The semiconductor device of claim 1, wherein the first die is configured as a logic die and the second die is configured as a memory die.

4. A semiconductor device, comprising:
a package structure comprising a first side and a second side opposite to the first side;
an interposer structure positioned over the first side of the package structure;
a first die positioned over the interposer structure;
a second die positioned over the interposer structure; and
a plurality of bottom interconnectors positioned on the second side of the package structure, and respectively comprising:
a bottom exterior layer positioned on the second side of the package structure;
a bottom interior layer enclosed by the bottom exterior layer;
a cavity enclosed by the bottom interior layer;
a base structure positioned opposite to the first side of the package structure and electrically connected to the plurality of bottom interconnectors; and
an upper circular pad and a lower circular pad;
wherein the upper circular pad is positioned between the bottom exterior layer and the package structure;
wherein the lower circular pad is positioned between the bottom exterior layer and the base structure.

* * * * *